United States Patent [19]

Kuroi et al.

[11] Patent Number: 5,538,916

[45] Date of Patent: Jul. 23, 1996

[54] METHOD OF MANUFACTURING SEMICONDUCTOR DEVICE ISOLATION REGION

[75] Inventors: Takashi Kuroi; Maiko Kobayashi, both of Hyogo, Japan

[73] Assignee: Mitsubishi Denki Kabushiki Kaisha, Tokyo, Japan

[21] Appl. No.: 230,567

[22] Filed: Apr. 20, 1994

[30] Foreign Application Priority Data

Apr. 28, 1993 [JP] Japan ................................. 5-102745
Dec. 27, 1993 [JP] Japan ................................. 5-330395

[51] Int. Cl.⁶ .................................................. H01L 21/76
[52] U.S. Cl. ................................................................ 437/72
[58] Field of Search ..................... 437/72; 148/DIG. 85, 148/DIG. 86, DIG. 117

[56] References Cited

U.S. PATENT DOCUMENTS 5,248,350  9/1993  Lee ........................................... 437/72

FOREIGN PATENT DOCUMENTS

| 60-716 | 1/1985 | Japan . |
|---|---|---|
| 61-100944 | 5/1986 | Japan . |
| 63-217640 | 9/1988 | Japan . |
| 63-217639 | 9/1988 | Japan . |
| 63-300526A | 12/1988 | Japan . |
| 210729 | 1/1990 | Japan . |
| 4-123431A | 4/1992 | Japan . |

OTHER PUBLICATIONS

Fu–Tai Liou et al. "A 0.8-µm CMOS Technology for High–Performance ASIC Memory and Channelless Gate Array," US period.: IEEE Journal of Solid State Circuits, vol. 24, No. 2, Apr. 1989, pp. 380 to 387.

Tomohisa Mizuno et al., "Oxidation Rate Reduction in the Submicrometer LOCOS Process," US period.: IEEE Transactions on Electron Devices, vol. ED–34, No. 11, Nov. 1987, pp. 2255 to 2259.

"Selective Polysilicon Oxidation Technology for Defect Free Isolation", Matsunaga et al., Tech. Dig. Int. Electron Device Meeting 1980, pp. 565–568.

A New Analytical Model of the "Bird's Beak", Guillemot et al., IEEE Transactions on Electron Devices, pp. 1033–1038.

"Influence of Film Stress and Thermal Oxidation on the Generation of Dislocations in Silicon", Bohg et al., Appl. Phys. Lett. 33 (10), 15 Nov. 1978, p. 895.

"A New Isolation Technology for VLSI", Nojiri et al., pp. 337–340, Extended Abstracts of the 17th Conference on Solid State Devices and Materials 1985.

"A Bird's Beak Free Local Oxidation Technology Feasible for VSLI Circuits Fabrication", Kyang Yi Chiu et al., IEEE Transactions on Electron Devices, pp. 536–540 1982.

"The Swami—A Defect Free and Near–Zero Bird's Beak Local Oxidation Process and its Application in VLSI Technology", K. Y. Chiu et al., IEDM 82, pp. 224–227.

*Primary Examiner*—George Fourson
*Attorney, Agent, or Firm*—Lowe, Price, LeBlanc & Becker

[57] ABSTRACT

The present invention aims to prevent formation of a bird's beak and a bird's head in forming a miniaturized element isolation oxide film, and to suppress introduction of a defect into a silicon substrate. A first silicon oxide film is formed on the surface of a silicon substrate. A polycrystalline silicon film and a first silicon nitride film having an opening are formed on surface of the first silicon oxide film. A second silicon oxide film is deposited on the surface of the first silicon oxide film and the first silicon nitride film so as to cover the inner wall of the opening by a CVD method. A second silicon nitride film formed to cover the surface of the second silicon oxide film is subjected to anisotropical etching, whereby a sidewall nitride film is formed on the surface of the second silicon oxide film so as to cover the sidewall of the opening. With the sidewall nitride film as a mask, an element isolation film is formed at the bottom of the opening.

9 Claims, 29 Drawing Sheets

METHOD OF MANUFACTURING SEMICONDUCTOR DEVICE ISOLATION REGION

BACKGROUND OF THE INVENTION

1. Field of the Invention

The present invention relates to a method of manufacturing a semiconductor device, and particularly to a method of manufacturing a semiconductor device having an element isolation structure.

2. Description of the Background Art

In manufacturing a semiconductor integrated circuit, an element isolation structure having an element isolation region is required for independently controlling each element without electrical interference between elements in operation. One well known method of forming an element isolation region is an LOCOS (Local Oxidation of Silicon) method, and various improvements have been employed.

As a first conventional method of manufacturing a semiconductor device, description will hereinafter be made on a method of forming an element isolation region disclosed in Japanese Patent Laying-Open No. 63-217639, and by T. Mizuno et al. in IEEE TRANSACTIONS ON ELECTRON DEVICES, VOL. ED-34, NO. 11, NOVEMBER 1987, pp. 2255–2259.

FIGS. 31 to 36 are cross sectional views sequentially showing the first conventional method of manufacturing the semiconductor device disclosed in the above prior art documents. Referring to FIG. 31, a silicon oxide film 303, a polycrystalline silicon film 305 and a first silicon nitride film 307 are formed sequentially in stack on the whole surface of a silicon substrate 301.

Referring to FIG. 32, a photoresist 321 is applied onto the whole surface of first silicon nitride film 307, and patterned in a desired configuration with photolithography or the like, so that a resist pattern 321 having a hole pattern 321a with an opening diameter $L_2$ is formed. With resist pattern 321 as a mask, first silicon nitride film 307 and polycrystalline silicon film 305 are sequentially etched away until the surface of silicon oxide film 303 is exposed. As a result, an opening 309 is formed in first silicon nitride film 307 and polycrystalline silicon film 305, which passes through these two layers and whose diameter is substantially the same as the opening diameter $L_2$. Thereafter, resist pattern 321 is removed.

Referring to FIG. 33, a second silicon nitride film 313a is formed on the surface of silicon oxide film 303 and first silicon nitride film 307 so as to cover an inner wall of opening 309. Anisotropical etching is effected on second silicon nitride film 313a.

Referring to FIG. 34, through this etching, a sidewall nitride film 313 is formed on the surface of silicon oxide film 303 so as to be left only at the sidewall of opening 309.

Referring to FIG. 35, silicon substrate 301 is selectively subjected to thermal oxidation process with sidewall nitride film 313 and first silicon nitride film 307 as a mask, to form an element isolation oxide film 315 at the bottom of opening 309. Thereafter, sidewall nitride film 313, first silicon nitride film 307, polycrystalline silicon film 305 and silicon oxide film 303 are sequentially etched away, resulting in the state shown in FIG. 36.

Japanese Patent Laying-Open No. 63-217640 discloses a method of forming an element isolation oxide film having a higher electrical isolation effect with the similar process as the above-described one, wherein on a silicon substrate formed is a groove within which an element isolation oxide film is formed. This method will hereinafter be described as a second conventional method of manufacturing a semiconductor device.

FIGS. 37 to 44 are cross sectional views showing in sequence the steps of the second conventional method of manufacturing the second conventional semiconductor device disclosed in the above publication. Referring to FIG. 37, a first silicon oxide film 403, a polycrystalline silicon film 405 and a first silicon nitride film 407 are formed sequentially in stack on the whole surface of a silicon substrate 401.

Referring to FIG. 38, a photoresist 421 is applied on the whole surface of first silicon nitride film 407, and patterned in a desired configuration by photolithography or the like to form a resist pattern 421. With resist pattern 421 as a masks first silicon nitride film 407 and polycrystalline silicon film 405 are sequentially etched away until the surface of first silicon oxide film 403 is exposed. Through the etching, a first opening 409a is formed passing through first silicon nitride film 407 and polycrystalline silicon film 405.

Referring to FIG. 39, first silicon oxide film 403 and silicon substrate 401 are sequentially etched away with resist pattern 421 being left. Through the etching, a second opening 409b passing through first silicon oxide film 403 and having a prescribed depth from the surface of silicon substrate 401 is formed. First and second openings 409a and 409b constitute an opening 409. Thereafter, resist pattern 421 is removed.

Referring to FIG. 40, the surface of silicon substrate 401 and polycrystalline silicon film 405 which is exposed at opening 409 is lightly oxidized by an oxidizing atmosphere, to form a second silicon oxide film 411 on the outer periphery of opening 409. Second silicon oxide film 411 relaxes a stress between silicon substrate 401 and a sidewall nitride film to be formed in a later process, in thermal oxidation process.

Referring to FIG. 41, a second silicon nitride film 413a is formed on the surface of second silicon oxide film 411 and first silicon nitride film 407 so as to cover the inner wall of opening 409. Subsequently, second silicon nitride film 413a is anisotropically etched back.

Referring to FIG. 42, through this etching, a sidewall nitride film 413 is formed on the surface of second silicon oxide film 411 so as to be left only at the sidewall of opening 409. With sidewall nitride film 413 and first silicon nitride film 407 as a mask, silicon substrate 401 is selectively subjected to thermal oxidation process.

Referring to FIG. 43, through the thermal oxidation process, an element isolation oxide film 415 is formed at the bottom of opening 409. Sidewall nitride film 413, first silicon nitride film 407, and first and second silicon oxide films 403 and 411 are sequentially etched away, resulting in the state shown in FIG. 44.

In the second conventional method of manufacturing the semiconductor device described above, second opening 409b having a prescribed depth from the surface of silicon substrate 401 is formed in the step shown in FIG. 39. At the bottom of second opening 409b element isolation oxide film 415 is formed. Element isolation oxide film 415, as shown in FIG. 44, is thus buried in a deeper region (in the direction of depth) than element isolation oxide film 315 shown in FIG. 36 from the upper surface of silicon substrate 401. Therefore, when elements are formed on both sides of element isolation oxide film 415, electrons must move between the elements around element isolation oxide film 415 through a region thereunder, which enhances the electrical isolation effect on element isolation oxide film 415 compared to element isolation oxide film 315.

The height from the upper surface of silicon substrate 401 up to the upper surface of element isolation oxide film 415 is reduced by the downwardly buried (in the direction of depth) amount of element isolation oxide film 415, so that the surface of silicon substrate 401 is well-planarized. Accordingly, when a gate electrode or an aluminum wiring is to be formed thereon, patterning thereof can be performed easily.

In the first and second conventional methods of manufacturing the semiconductor device, the polycrystalline silicon film is formed between the first silicon oxide film and the first silicon nitride film. Since the polycrystalline silicon film has a higher oxidation rate compared to a silicon nitride film, oxidation in a longitudinal direction (the direction of film thickness) is dominant, while oxidation in a lateral direction is suppressed, whereby formation of a bird's beak is suppressed. Such suppression of a bird's beak by the polycrystalline silicon film is described in Tech. Dig. Int. Electron Device Meeting 1980 pp. 565–568.

The following two problems arise in the first and second conventional methods of manufacturing the semiconductor device.

A first problem is that the thickness of first silicon nitride film 307 is reduced in etchback of second silicon nitride film 313a shown in FIG. 33, causing a bird's head and a bird's beak. Detailed description thereof will be hereinafter given with respect to the first conventional manufacturing method as an example.

In the first conventional method of manufacturing the semiconductor device, opening 309 is formed in silicon nitride film 307 and polycrystalline silicon film 305 with resist pattern 321 patterned by photolithography or the like as a mask, in the step shown in FIG. 32. The diameter $L_2$ of opening 309 is thus determined by resolution of the photolithography. Specifically, the opening diameter $L_2$ is 0.3 μm in the minimum processed dimension by photolithography utilizing an excimer laser beam, and cannot be made smaller than 0.3 μm by photolithography. Accordingly, sidewall nitride film 313 is formed in the step shown in FIG. 34, by which the dimension $L_{2b}$ of silicon oxide film 303 exposed out of sidewall nitride film 313 can be made smaller by the width $L_{2a}$ of sidewall nitride film 313 than the minimum processed dimension $L_2$ (approximately 0.3 μm) by photolithography ($L_{2b}=L_2-(2\times L_{2a})$). Since the dimension $L_{2b}$ of the exposed surface of silicon oxide film 303 can be made smaller than the minimum processed dimension by photolithography, a miniaturized element isolation oxide film can be formed, which will meet a requirement for miniaturization.

Sidewall nitride film 313, however, is formed by etchback of second silicon nitride film 313a as shown in FIGS. 33 and 34. In this etchback, second silicon nitride film 313a is usually overetched by approximately 20 to 30% of its thickness. Therefore, first silicon nitride film 307 is also etched away together with second silicon nitride film 313a, so that the thickness of first silicon nitride film 307 is reduced. Particularly, with regard to miniaturization of elements, the thickness of first silicon nitride film 307 is considered to be significantly reduced. When thermal oxidation process is performed for forming element isolation oxide film 315 with the thickness of first silicon nitride film 307 being small, the length of a bird's beak 315b is increased as shown in FIG. 45.

This is expressed by the following relation between a thickness tn of first silicon nitride film 307 and a bird's beak amount $L_b$, described by N. Guillemot et al., in IEEE Electron Device, ED-34, 1034 (1987):

$$L_b = KL \left[ (-T_{ox} + 1580.3)F_0^{0.67} \cdot \exp\left\{ -\frac{(tn - 0.08)^2}{0.06} \right\} t_{ox}^{0.3} \right]$$

where $T_{OX}$ indicates an oxidizing temperature, $t_{OX}$ indicates a thickness of a pad oxide film, and KL is a constant.

The experimental data thereof is described by T. Mizuno et al., in IEEE Transactions on Electron Devices, VOL. ED-34, No. 11, November 1987, pp. 2255–2259.

The fact that the smaller thickness of first silicon nitride film 307 results in the larger bird's beak amount $L_b$ can be explained as follows. Referring to FIG. 45, when the thickness of first silicon nitride film 307 is reduced, flexural rigidity thereof is reduced, so that first silicon nitride film 307 may easily lift up. As a result, an oxidation species tends to be introduced between silicon oxide film 303 and polycrystalline silicon film 305 and between silicon oxide film 303 and silicon substrate 301. Polycrystalline silicon film 305 is thus considerably oxidized to cause a bird's head, and silicon substrate 301 is also oxidized to increase the bird's beak.

Referring to FIG. 46, a width $W_{2a}$ of element isolation oxide film 315 thus formed is increased by the length of bird's head and bird's beak 315b. As a result, in spite of provision of sidewall nitride film 313 for forming a miniaturized element isolation oxide film, the thickness of silicon nitride film 307 is decreased, whereby miniaturization cannot be accomplished.

Also in the second conventional manufacturing method, a width $W_{3a}$ of element isolation oxide film 415 is increased by the length of bird's head and bird's beak 415b as shown in FIGS. 48 and 49 for the above reason.

A second problem is that a defect is introduced into silicon substrate 301 in thermal oxidation, thereby lowering a junction breakdown voltage thereof, which will be described in detail with respect to the first conventional manufacturing method.

Referring to FIG. 34, in the first conventional method of manufacturing the semiconductor device, silicon oxide film 303 is formed to have the thickness of approximately 150 Å. In general, thermal expansion coefficients of silicon substrate 301 and sidewall nitride film 313 are significantly different. Therefore, when sidewall nitride film 313 is directly formed on silicon substrate 301 without interposing silicon oxide film 303 therebetween, a defect or a stress might be introduced into silicon substrate 301 due to heat applied in thermal oxidation. In order to prevent this, silicon oxide film 303 is interposed between silicon substrate 301 and silicon nitride film 303, as shown in FIG. 34. Silicon oxide film 303 serves as relaxing a stress caused by the difference of the thermal expansion coefficients.

However, when a ratio $T_{O2}/T_{N2}$ of a thickness $T_{O2}$ of silicon oxide film 303 to a height $T_{N2}$ of sidewall nitride film 313 is smaller than a prescribed value, silicon substrate 301 cannot relax the stress completely, whereby a defect 317 or a stress may be introduced into silicon substrate 301 in the vicinity of an edge of isolation oxide film 315 in thermal oxidation, as shown in FIG. 45. This is described by A. Bohg et al., in Appl. Phys. Lett. 33 (10), 15 Nov. 1978, p. 895.

Such introduction of defect 317 or a stress into silicon substrate 301 leads to distribution of defects 317 over a p-n junction portion including p-type silicon substrate 301 and an n-type impurity region 319 formed on either side of element isolation oxide film 315, as shown in FIG. 47. In this case, the junction breakdown voltage might be reduced because of current leakage through defects 317 distributed over the junction portion.

However, if the thickness of silicon oxide film 303 is increased in order to increase a ratio $T_{O2}/T_{N2}$ of the thickness $T_{O2}$ of silicon oxide film 303 to the height $T_{N2}$ of sidewall nitride film 313 larger than a prescribed value, the amount of a bird's beak would be increased.

Also in the second conventional manufacturing method, defect 317 or a stress may be introduced, for the same reason as above, into silicon substrate 401 around an edge of isolation oxide film 415a as shown in FIGS. 48 and 49, thereby causing current leakage in a p-n junction portion of p-type silicon substrate 401 and an n-type impurity region 419, as shown in FIG. 50, so that the junction breakdown voltage thereof is decreased.

Also in this case, if a thickness $T_{O3}$ is increased in order to increase a ratio $T_{O3}/T_{N3}$ of the thickness $T_{O3}$ of second silicon oxide film 403 to a height $T_{N3}$ of sidewall nitride film 413 larger than a prescribed value as shown in FIG. 42, the amount of a bird's beak would be increased. More specifically, second silicon oxide film 411 is formed through oxidation. Polycrystalline silicon film 405 and silicon substrate 401 are at this time oxidized by the thickness $T_{O3}$ from the sidewall of opening 409 toward the outer periphery (as indicated by the arrow R). If thermal oxidation is performed with polycrystalline silicon film 405 and silicon substrate 401 oxidized by a large thickness at the outer periphery of opening 409, the length $W_{3a}$ of element isolation oxide film 415 will be increased by the thickness $T_{O3}$ toward the outer periphery of opening 409, as shown in FIG. 49. Accordingly, the thickness of second silicon oxide film 403 cannot be increased in the step shown in FIG. 40.

As described above, simple provision of frames 313 and 413 for thermal oxidation does not contribute to miniaturization of element isolation oxide films 315 and 415 against its purpose, and decreases electrical reliability of the element isolation structure.

Referring to FIG. 51, when second silicon oxide film 411 is formed on the inner wall surface of opening 409 through thermal oxidation, an oxidizing agent cannot easily enter a corner portion (a region C) of opening 409. The corner portion is hardly oxidized because of its high stress and suppressed oxidation rate. As a result, when sidewall nitride film 413 is formed as shown in FIG. 42, the thickness of the oxide film on the lower side of sidewall nitride film 413 is small, so that a defect tends to be introduced into silicon substrate 401 in a heat treatment with sidewall nitride film 413 as a mask. Therefore, the above-described reduction in the junction breakdown voltage will be promoted when second silicon oxide film 411 is formed on the inner wall of opening 409 by thermal oxidation.

SUMMARY OF THE INVENTION

One object of the present invention is to prevent formation of a bird's beak and a bird's head when forming an element isolation oxide film.

Another object of the present invention is to suppress introduction of a defect and the like into a silicon substrate when forming an element isolation oxide film.

Still another object of the present invention is to provide a method of forming an element isolation structure of high electrical reliability, applicable to miniaturization.

In one aspect of the present invention, a method of manufacturing a semiconductor device having an element isolation structure includes the following steps.

A first silicon nitride film is initially formed to have an opening partially exposing a surface of a first silicon oxide film formed on a main surface of a silicon substrate. A second silicon oxide film is formed on the surface of the first silicon oxide film and the first silicon nitride film so as to cover an inner wall of the opening. A second silicon nitride film is formed on the second silicon oxide film. The second silicon nitride film is left at a sidewall of the opening on the second silicon oxide film to form a sidewall nitride film. Thermal oxidation is performed with the sidewall nitride film as a mask to form an element isolation oxide film at the bottom of the opening.

In the method of manufacturing the semiconductor device in accordance with the one aspect of the present invention, the second silicon nitride film formed on the second silicon oxide film is subjected to anisotropical etching, for example, to form the sidewall nitride film. The second silicon oxide film serves as an etching stopper in etching the second silicon nitride film. Since the first silicon nitride film on the lower side of the second silicon oxide film cannot be etched in etching of the second silicon nitride film, the thickness of the first silicon nitride film cannot be decreased. An oxidation species, therefore, would not easily enter the polycrystalline silicon film and the silicon substrate in thermal oxidation for forming the element isolation oxide film, so that formation of a bird's head and a bird's beak caused by oxidation of the polycrystalline silicon film and the silicon substrate can be suppressed. Accordingly, the length of the element isolation oxide film will not be increased because of formation of a bird's head and a bird's beak, whereby a miniaturized element isolation oxide film can be formed, enabling miniaturization of the structure.

Since the second silicon oxide film is formed on the surface of the first silicon oxide film at the bottom of the opening, the first and second silicon oxide films are interposed between the silicon substrate and the sidewall nitride film, so that these two films ensure the thickness therebetween, and the thickness of the second silicon oxide film can be made large. It is thus easy to set a ratio $T_O/T_N$ of the sum $T_O$ of the thicknesses of the first and second silicon oxide films to a height $T_N$ of the sidewall nitride film along the sidewall thereof not less than a prescribed value, whereby a stress caused by the difference between thermal expansion coefficients of the sidewall nitride film and the silicon substrate can be relaxed by the second silicon oxide film. Consequently, introduction of a defect to the surface of the silicon substrate can be suppressed, and therefore, reduction in the junction breakdown voltage due to distribution of the defects in the vicinity of the p-n junction portion is suppressed.

In another aspect of the present invention, a method of manufacturing a semiconductor device includes the following steps.

Initially, a first silicon oxide film and a first silicon nitride film are formed sequentially in stack, so as to have an opening in communication with a hole formed on a main surface of a silicon substrate. A second silicon oxide film is formed on the surface of the silicon substrate and the first silicon nitride film, so as to cover an inner wall of the hole and the opening. A second silicon nitride film is formed on the second silicon oxide film. The second silicon nitride film is left at a sidewall of the opening and the hole on the second silicon oxide film to form a sidewall nitride film. Thermal oxidation is performed with the sidewall nitride film as a mask to form an element isolation oxide film at the bottom of the hole.

In the method of manufacturing the semiconductor device in accordance with the another aspect of the present invention, the second silicon nitride film formed on the second silicon oxide film is subjected to anisotropical etching, for example, to form the sidewall nitride film. The second silicon oxide film serves as an etching stopper in etching of the second silicon nitride film. Since the first silicon nitride film on the lower side of the second silicon oxide film cannot be etched in etching of the second silicon nitride film, the thickness of the first silicon nitride film cannot be decreased. Accordingly, an oxidation species will not be easily enter the polycrystalline silicon film and the silicon substrate in thermal oxidation for forming the element isolation oxide film, which suppresses formation of a bird's head and a bird's beak caused by oxidation of the polycrystalline silicon film and the silicon substrate. The length of the element isolation oxide film will thus not be increased due to formation of a bird's head and a bird's beak, which implements miniaturized isolation, enabling miniaturization of the structure.

The second silicon oxide film is interposed between the silicon substrate and the sidewall nitride film at the bottom of the hole. The second silicon oxide film is formed to cover the sidewall of the hole and the opening by e.g. a CVD method. Specifically, the second silicon oxide film is deposited on the inner periphery of the sidewall of the hole and the opening. This facilitates forming the second silicon oxide film large in thickness, and thus, setting the ratio $T_O/T_N$ of the thickness $T_O$ of the second silicon oxide film to the height $T_N$ of the sidewall nitride film along the sidewall thereof not less than a prescribed value. Consequently, a stress caused by the difference between the thermal expansion coefficients of the sidewall nitride film and the silicon substrate can be relaxed by the second silicon oxide film, which prevents introduction of a defect to the surface of the silicon substrate, so that reduction in the junction breakdown voltage due to distribution of the defects in the vicinity of the p-n junction portion is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will hereinafter be described with reference to the drawings.

EMBODIMENT 1

Description will now be made on a method of manufacturing a semiconductor device in a first embodiment of the present invention.

Figure 1:
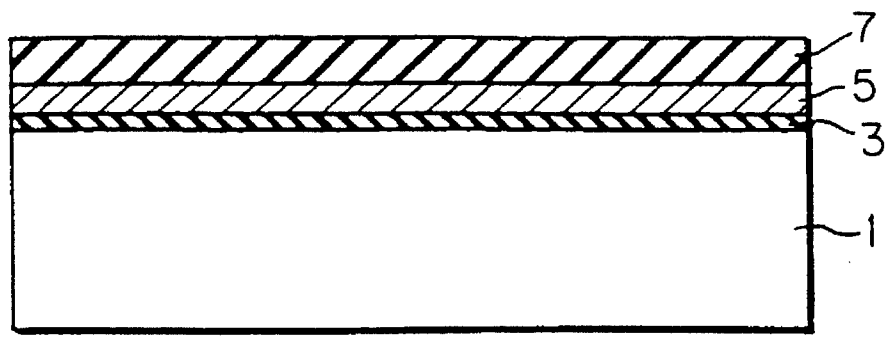
FIGS. 1 to 7 are cross sections showing in sequence the steps of a method of manufacturing a semiconductor device in a first embodiment of the present invention.

Referring to FIG. 1, a silicon substrate 1 is oxidized to form a first silicon oxide film 3 having the thickness of approximately 150 Å on the whole surface of silicon substrate 1. A polycrystalline silicon film 5 and a first silicon nitride film 7 having the thickness of approximately 500 Å and 2000 Å, respectively, are deposited on the whole surface of first silicon oxide film 3 by a CVD (Chemical Vapor Deposition) method or the like.

Figure 2:
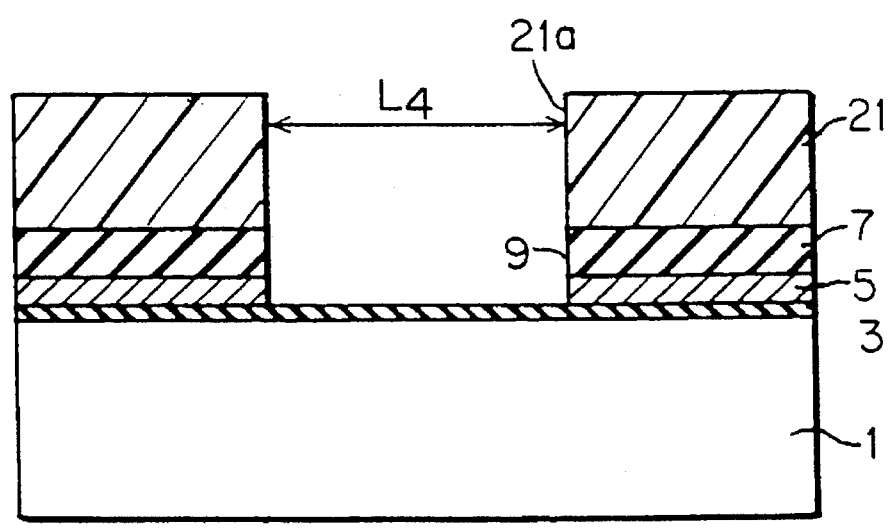

Referring to FIG. 2, a photoresist 21 is applied on the whole surface of first silicon nitride film 7. Photoresist 21 is patterned with photolithography to form a resist pattern 21 having a hole pattern 21a with an opening diameter $L_4$. When photoresist 21 is exposed to an excimer laser beam, the minimum processed dimension of the opening diameter $L_4$ of hole pattern 21a is 0.3 µm. First silicon nitride film 7 and polycrystalline silicon film 5 are sequentially subjected to anisotropical etching with resist pattern 21 as a mask, to form an opening 9 passing through these two layers and partially exposing the surface of first silicon oxide film 3. Opening 9 has the opening diameter substantially the same as the opening diameter $L_4$ of hole pattern 21a, i.e. 0.3 µm. Thereafter, resist patter 21 is removed.

Figure 3:
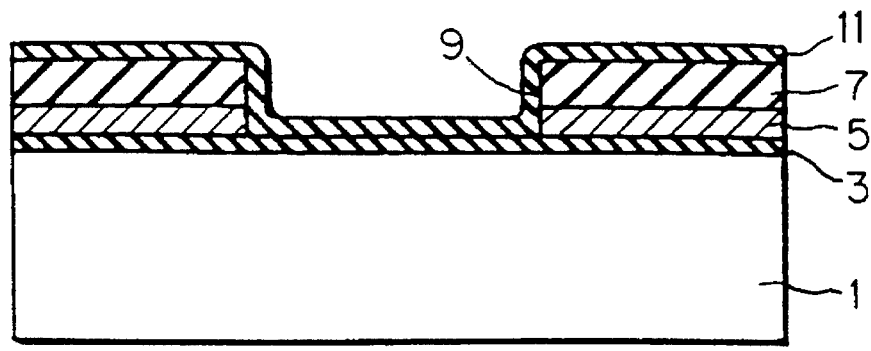

Referring to FIG. 3, a second silicon oxide film 11 having the thickness of approximately 150 Å is formed on the surface of first silicon oxide film 3 and first silicon nitride film 7 by a CVD method, so as to cover the inner wall of opening 9.

Figure 4:
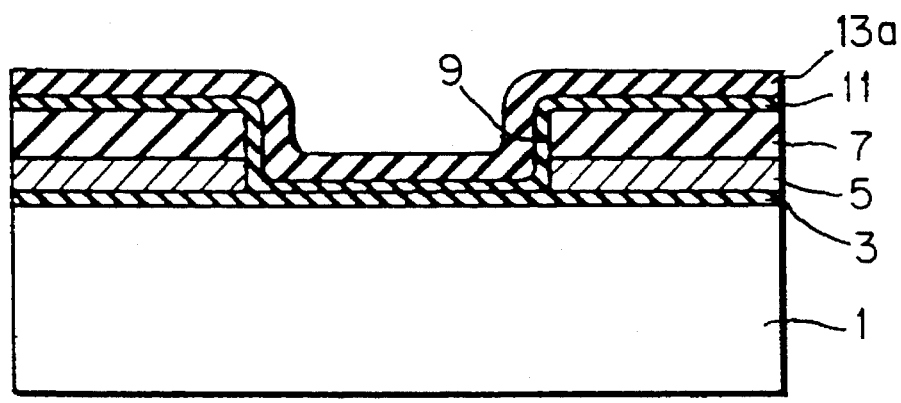

Referring to FIG. 4, a second silicon nitride film 13a having the thickness of approximately 500 Å is formed on the whole surface of second silicon oxide film 11. Second silicon nitride film 13a is then subjected to anisotropical etching in which the thickness of second silicon nitride film 13a is overetched by 20 to 30% thereof. In this etching, second silicon oxide film 11 serves as a etching stopper. More specifically, existence of second silicon oxide film 11 prevents decrease in the thickness of first silicon nitride film 7 in spite of anisotropical etching of second silicon nitride film 13a.

Figure 5:
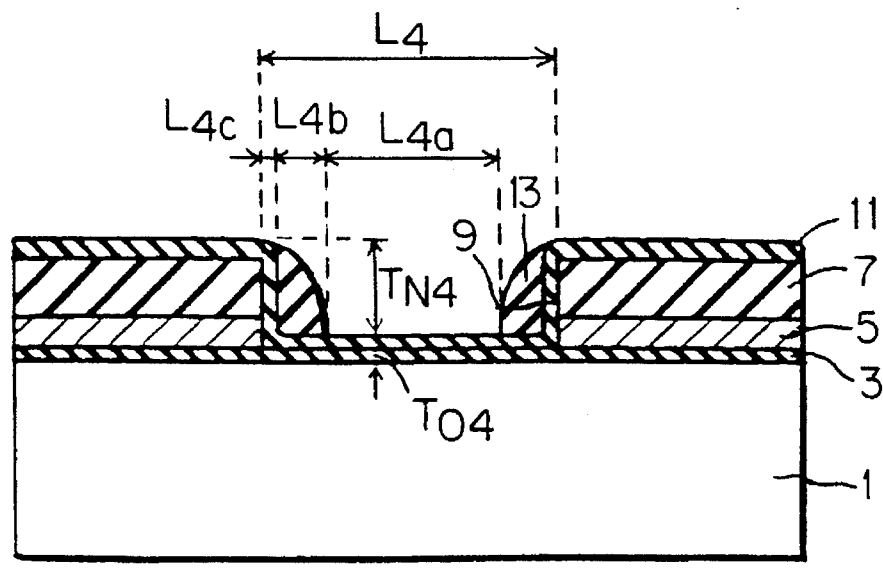

Referring to FIG. 5, through the above etching, a sidewall nitride film 13 is formed on the surface of second silicon oxide film 11 so as to cover the sidewall of opening 9.

Sidewall nitride film 13 is formed to have a width $L_{4b}$ of e.g. 500 Å, approximately. Such provision of sidewall nitride film 13 enables a dimension $L_{4a}$ of an exposed surface of second silicon oxide film 11 at the bottom of opening 9 to be made smaller than the minimum processed dimension $L_4$ (=0.3 μm) by photolithography. Specifically, the dimension $L_{4a}$ of the exposed surface is expressed by $L_{4a}=L_4-2\times(L_{4b}+L_{4c})$, which results in approximately 0.2 μm.

Thereafter, thermal oxidation is performed at the temperature of approximately 950° to 1100° C. with sidewall nitride film 13 as a mask. This thermal oxidation takes, for example, 2 to 3 hours at 950° C., and 30 minutes at 1100° C.

Figure 6:
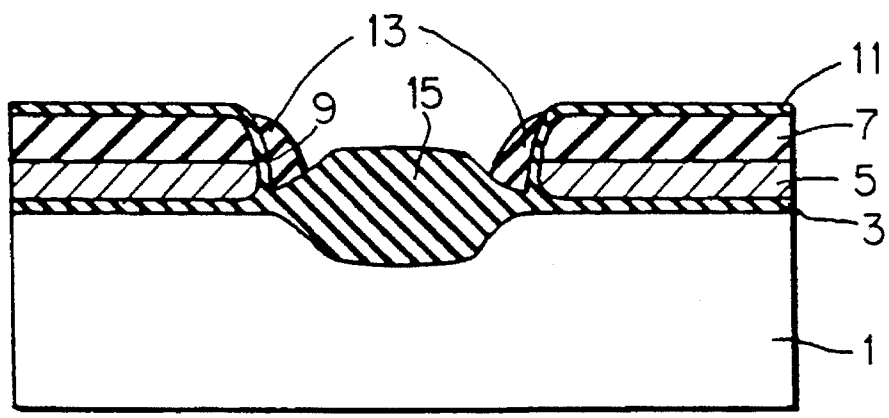
Figure 7:
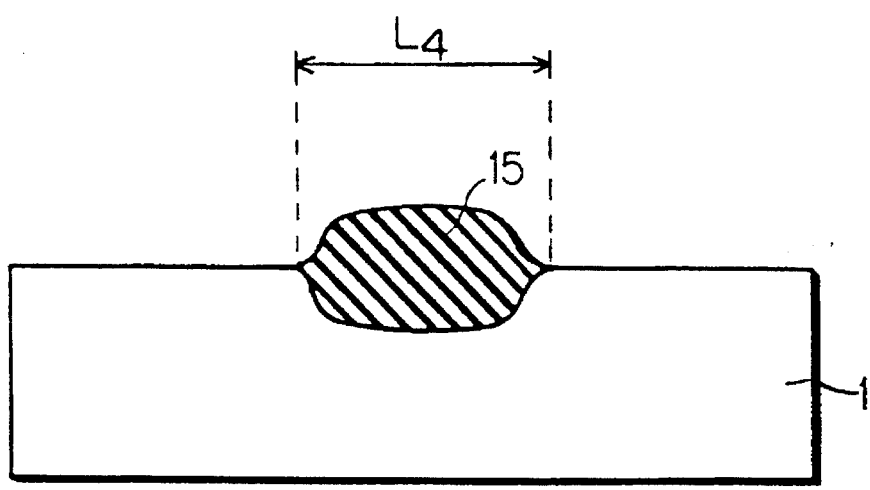

Referring to FIG. 6, through this thermal oxidation, an element isolation oxide film 15 having the thickness of approximately 5000 Å is formed at the bottom of opening 9. Sidewall nitride film 13, second silicon oxide film 11, first silicon nitride film 7, polycrystalline silicon film 5 and first silicon oxide film 3 are sequentially etched away, resulting in the state shown in FIG. 7.

In the method of manufacturing the semiconductor device in the first embodiment of the present invention, second silicon oxide film 11 is formed on the surface of first silicon nitride film 7 by a CVD method in the step shown in FIG. 3. Second silicon oxide film 11, therefore, exists between second silicon nitride film 13a and first silicon nitride film 7 in etching second silicon nitride film 13a for forming sidewall nitride film 13 in the steps shown in FIGS. 4 and 5. Since second silicon oxide film 11 serves as an etching stopper in etching second silicon nitride film 13a, first silicon nitride film 7 cannot be etched together with second silicon nitride film 13a, so that reduction in the thickness of second silicon nitride film 13a is prevented. Accordingly, in thermal oxidation in the steps shown in FIGS. 5 and 6, an oxidation species could not easily enter between first silicon oxide film 3 and polycrystalline silicon film 5 and between silicon substrate 1 and first silicon oxide film 3, whereby formation of a bird's beak and a bird's head caused by oxidation of silicon substrate 1 and polycrystalline silicon film 5 can be suppressed. This enables formation of miniaturized element isolation oxide film 15 shown in FIG. 7 with the reduced length $W_4$.

In the step shown in FIG. 3, second silicon oxide film 11 is formed to cover the sidewall of opening 9 on the surface of first silicon oxide film 3 by a CVD method. First silicon oxide film 3 and second silicon oxide film 11 ensure the thickness of the silicon oxide film on silicon substrate 1. In general, the thickness of first silicon oxide film 3 cannot be made not less than a prescribed value, because the amount of a bird's beak at the element isolation oxide film after thermal oxidation will be increased if the thickness of first silicon oxide film 3 is increased. On the contrary, the thickness of second silicon oxide film 11 can be easily made larger, because it hardly affects the amount of the bird's beak.

The sum $T_{O4}$ of the thicknesses of first and second silicon oxide films 3 and 11 shown in FIG. 5 can be increased by making the thickness of first silicon oxide film 11 larger. This enables the ratio $T_{O4}/T_{N4}$ of the thickness $T_{O4}$ to the height $T_{N4}$ of sidewall nitride film 13 along the sidewall thereof to be increased. Accordingly, introduction of a defect into silicon substrate 1 caused by the small ratio $T_{O4}/T_{N4}$ can be suppressed, so that reduction in the junction breakdown voltage caused by distribution of the defects in the vicinity of the p-n junction portion can be suppressed.

Referring to FIG. 5, provision of sidewall nitride film 13 enables the dimension $L_{4a}$ of the exposed surface of second silicon oxide film 11 at the bottom of opening 9 to be reduced smaller than the minimum processed dimension $L_4$ (0.3 μm) by photolithography, so that the length $W_4$ of element isolation oxide film 15 formed at the bottom of opening 9 can also be reduced smaller than the minimum processed dimension $L_4$. Consequently, a miniaturized element isolation oxide film can be formed.

EMBODIMENT 2

Description will now be made on a method of manufacturing a semiconductor device in a second embodiment of the present invention.

Figure 8:
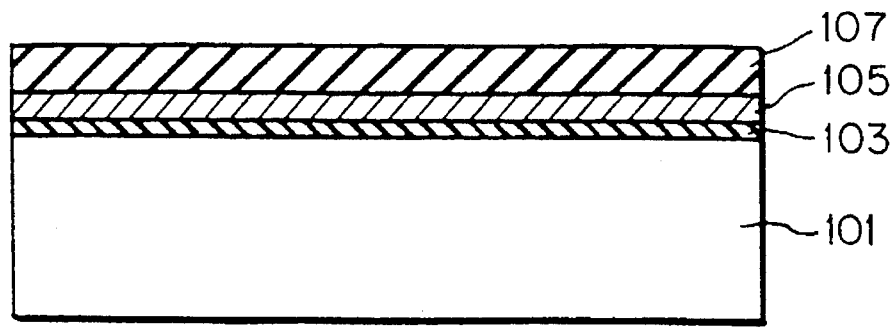
FIGS. 8 to 15 are cross sections showing in sequence the steps of a method of manufacturing a semiconductor device in a second embodiment of the present invention.

Referring to FIG. 8, the surface of a silicon substrate 101 is oxidized to form a first silicon oxide film 103 having the thickness of approximately 150 Å. On the surface of first silicon oxide film 103 deposited are a polycrystalline silicon film 105 and a first silicon nitride film 107 having the thicknesses of approximately 500 Å and 2000 Å, respectively, by a CVD method.

Figure 9:
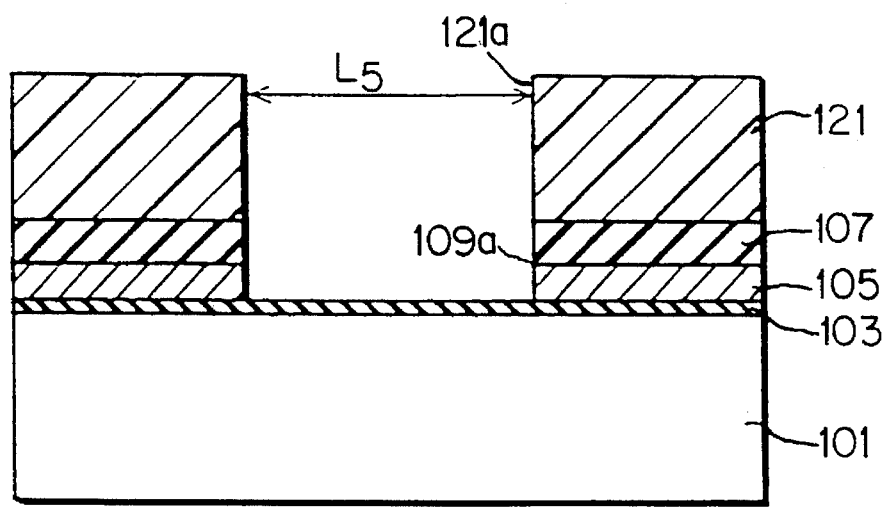

Referring to FIG. 9, a photoresist 121 is applied onto the whole surface of first silicon nitride film 107. Photoresist 121 is patterned so as to have a hole pattern 121a with an opening diameter $L_5$. With resist pattern 121 as a mask, first silicon nitride film 107 and polycrystalline silicon film 105 are sequentially subjected to anisotropical etching, to form an opening 109a passing through these two layers and partially exposing the surface of first silicon oxide film 103. Opening 109a has the opening diameter substantially the same as the opening diameter $L_5$ of hole pattern 121a.

Figure 10:
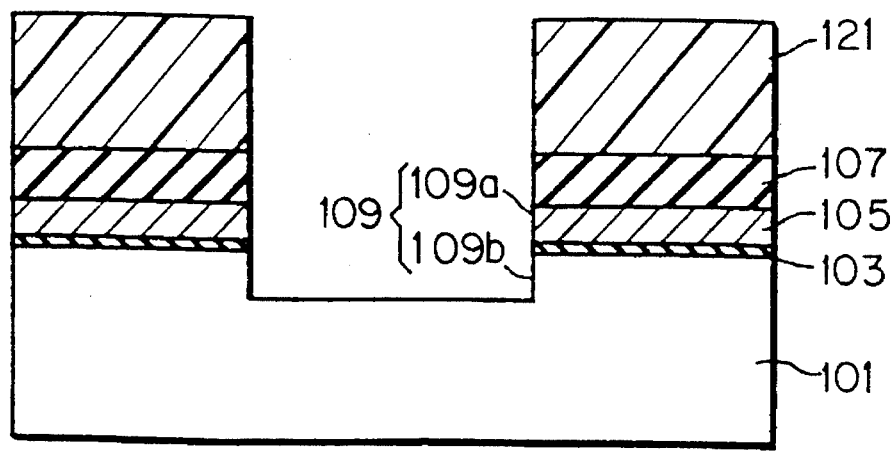

Referring to FIG. 10, with resist pattern 121 being left, first silicon oxide film 103 and silicon substrate 101 are sequentially subjected to anisotropical etching, so that a second opening 109b having the sidewall in flush with that of first opening 109a is formed in first silicon oxide film 103 and silicon substrate 101. First opening 109a and second opening 109b constitute an opening 109. Thereafter, resist pattern 121 is removed.

Figure 11:
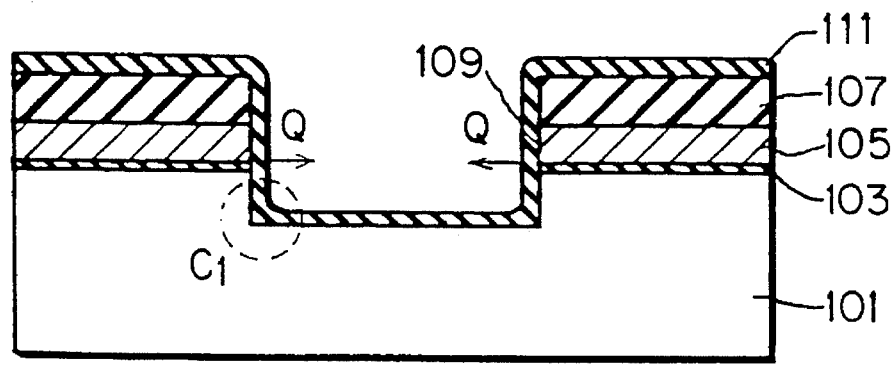

Referring to FIG. 11, a second silicon oxide film 111 having the thickness of approximately 150 Å is formed on the surface of silicon substrate 101 and first silicon nitride film 107 by a CVD method, so as to cover the sidewall of opening 109.

Figure 12:
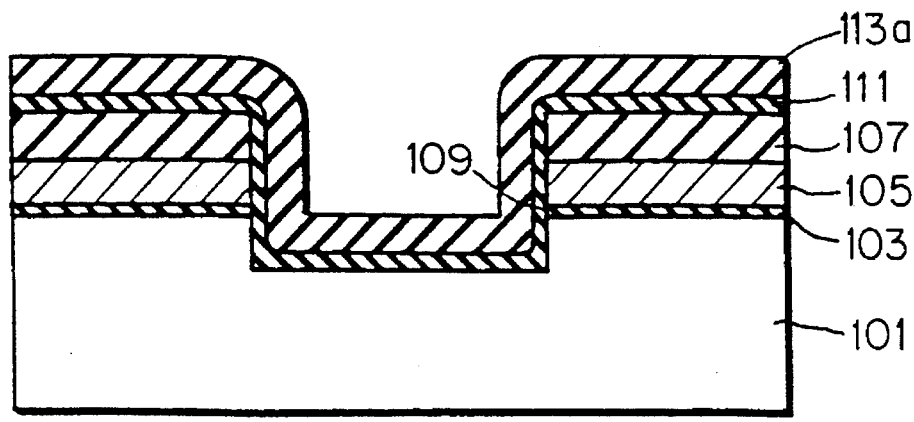

Referring to FIG. 12, a second silicon nitride film 113a is formed on the whole surface of second silicon oxide film 111. Second silicon nitride film 113a is subjected to anisotropical etching in which the thickness of silicon nitride film 113a is overetched by 20 to 30% thereof. In this etching, second silicon oxide film 111 serves as an etching stopper, so as to prevent the thickness of first silicon nitride film 107 to be decreased.

Figure 13:
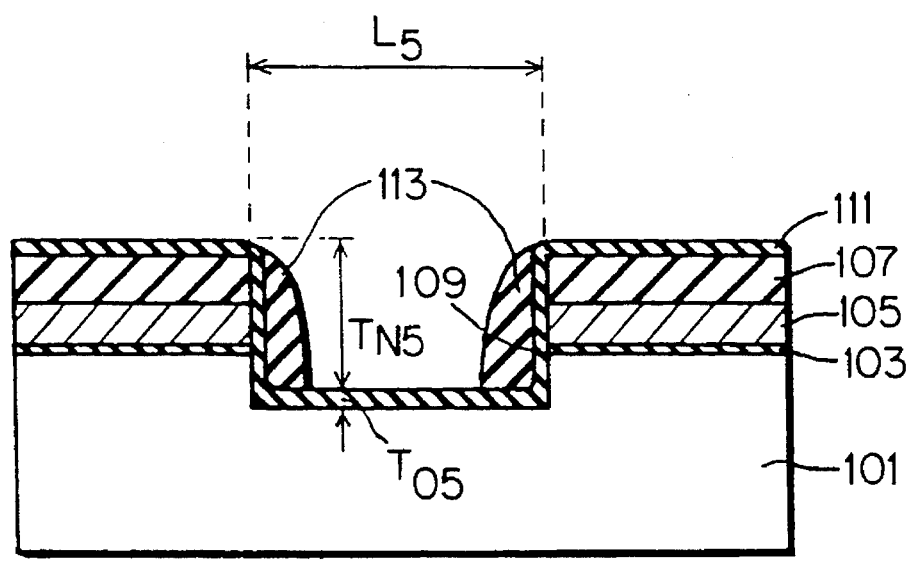

Referring to FIG. 13, a sidewall nitride film 113 is formed on the surface of second silicon oxide film 111 so as to cover the sidewall of opening 109, through the above etching. With sidewall nitride film 113 as a mask, silicon substrate 101 is subjected to thermal oxidation at the temperature of 950° to 1100° C. The thermal oxidation takes, for example, 2 to 3 hours at 950° C., and 30 minutes at 1100° C.

Figure 14:
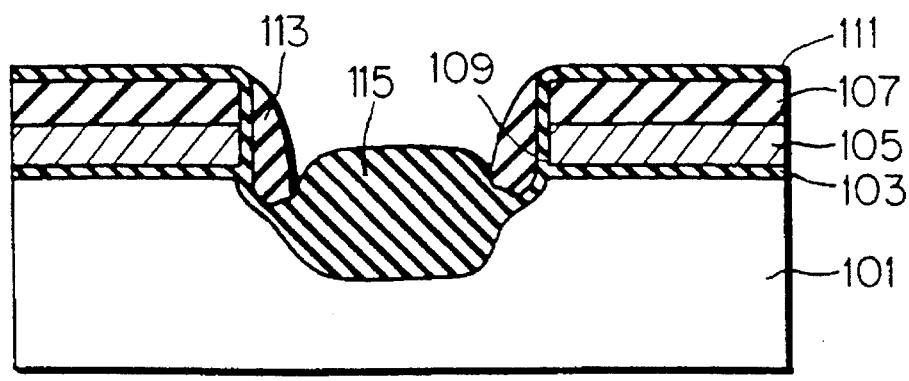

Referring to FIG. 14, an element isolation oxide film 115 having the thickness of approximately 5000 Å is formed at the bottom of opening 109 through this thermal oxidation.

Figure 15:
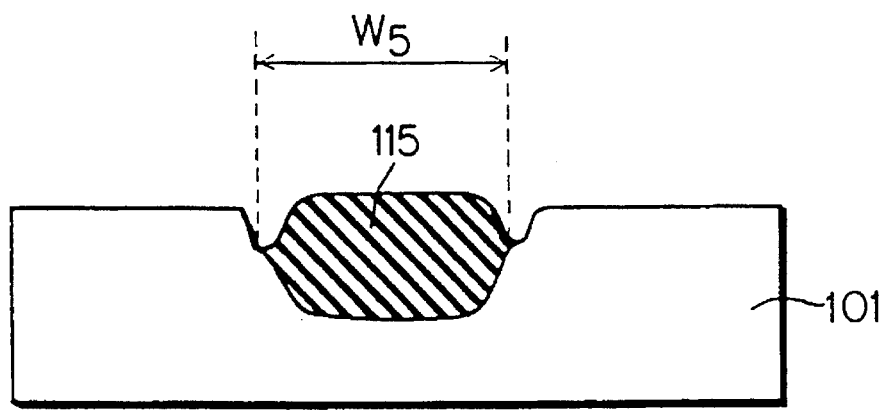

Sidewall nitride film 113, second silicon oxide film 111, first silicon nitride film 107, polycrystalline silicon film 105 and first silicon oxide film 103 are sequentially etched away, resulting in the state shown in FIG. 15.

In the method of manufacturing the semiconductor device in the second embodiment of the present invention, second silicon oxide film 111 is formed on the surface of first silicon nitride film 107 by a CVD method in the step shown in FIG. 11. Accordingly, second silicon oxide film 111 exists between second silicon nitride film 113a and first silicon nitride film 107 as shown in FIGS. 12 and 13, serving in etching of second silicon nitride film 113a as an etching stopper which prevents etching of first silicon nitride film 107, thereby preventing reduction in the thickness of first silicon nitride film 107. Consequently, an oxidation species cannot easily enter between first silicon oxide film 103 and polycrystalline silicon film 105 and between first silicon oxide film 103 and silicon substrate 101 in thermal oxidation shown in FIGS. 13 and 14. This suppresses formation of a bird's beak and a bird's head caused by oxidation of silicon substrate 101 and polycrystalline silicon film 105, whereby the length $W_5$ of element isolation oxide film 115 shown in FIG. 15 can be reduced, and miniaturization of element isolation oxide film 115 can be accomplished.

Figure 40:
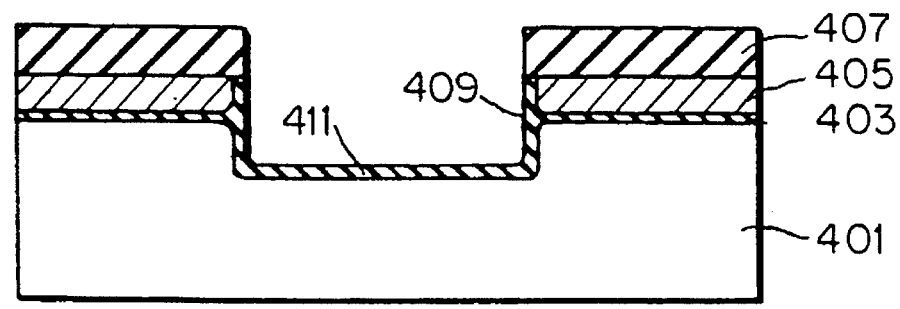
Figure 41:
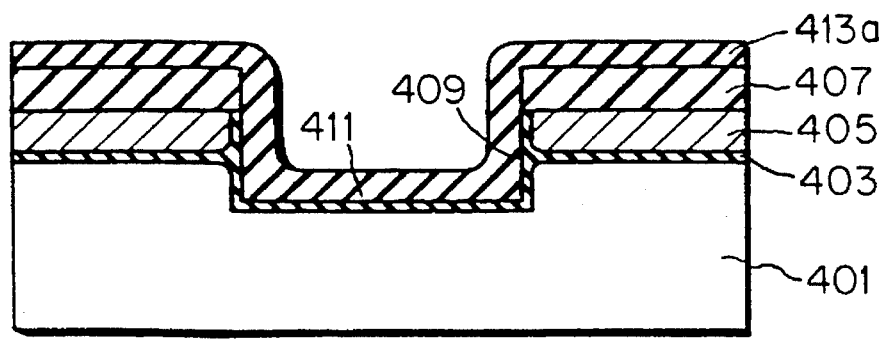

In the step shown in FIG. 11, second silicon oxide film 111 is formed on the surface of silicon substrate 101 so as to cover the sidewall of opening 109 by a CVD method. Such formation of second silicon oxide film 111 by a CVD method can suppress formation of a bird's beak more effectively than in formation of second silicon oxide film 411 by oxidation as shown in FIG. 40, the reason of which will hereinafter be described in detail.

Figure 42:
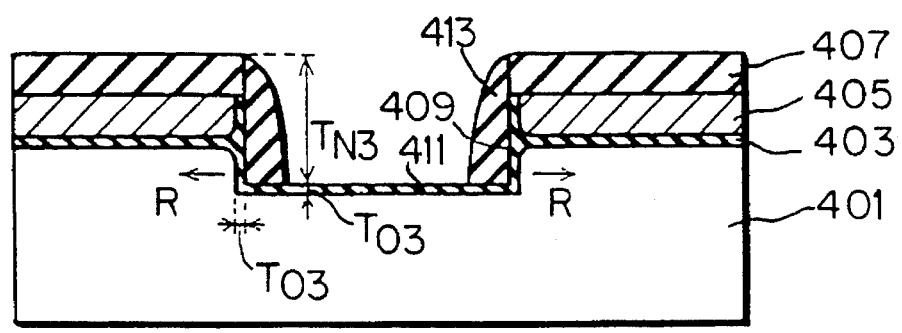
Figure 43:
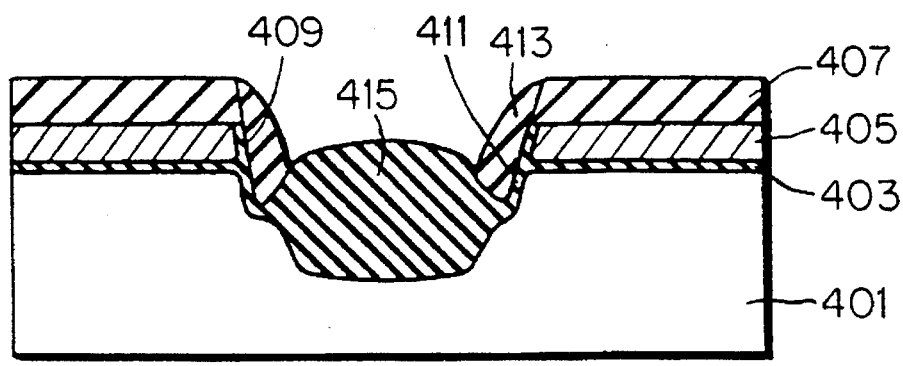
Figure 44:
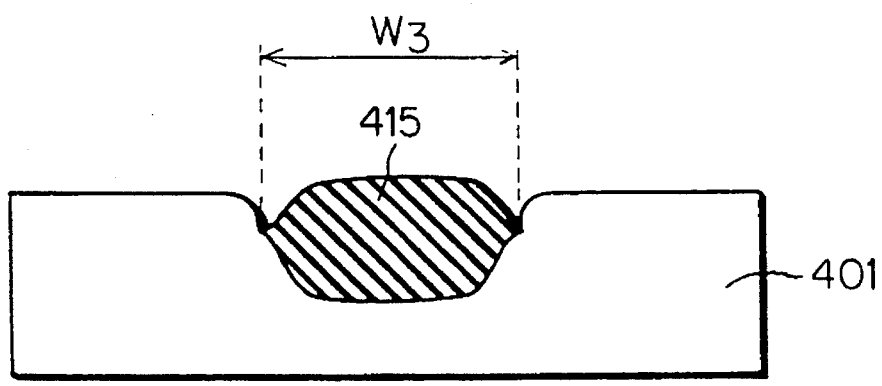
Figure 45:
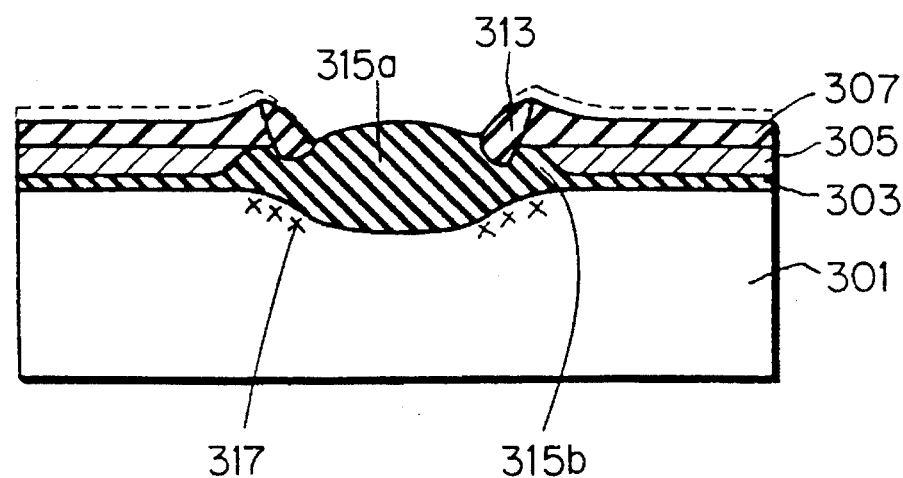
FIGS. 45 to 47 are cross sections showing in sequence the steps of the first conventional method of manufacturing the semiconductor device in the case of abuse.
Figure 46:
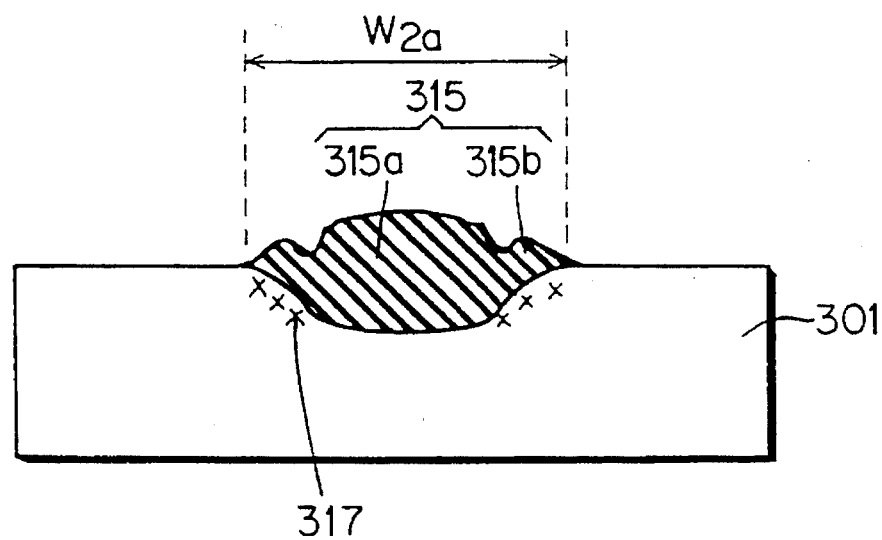
Figure 47:
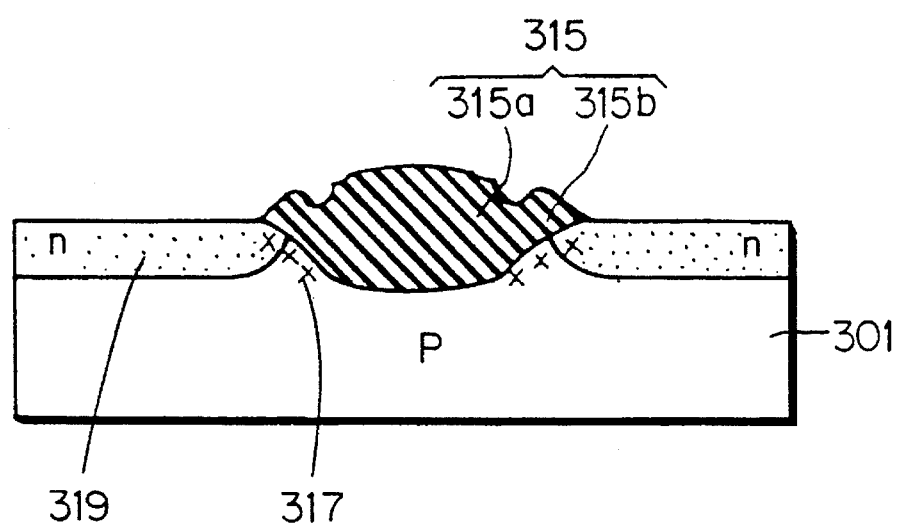
Figure 48:
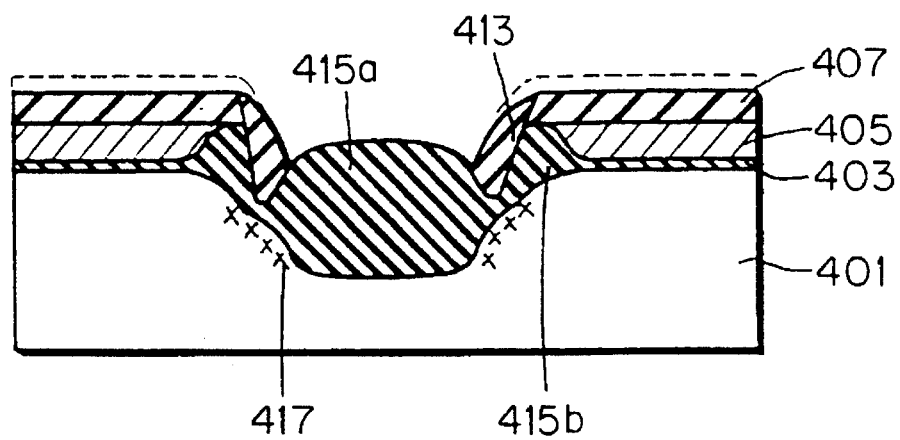
FIGS. 48 to 50 are cross sections showing in sequence the steps of the second conventional method of manufacturing the semiconductor device in the case of abuse.
Figure 49:
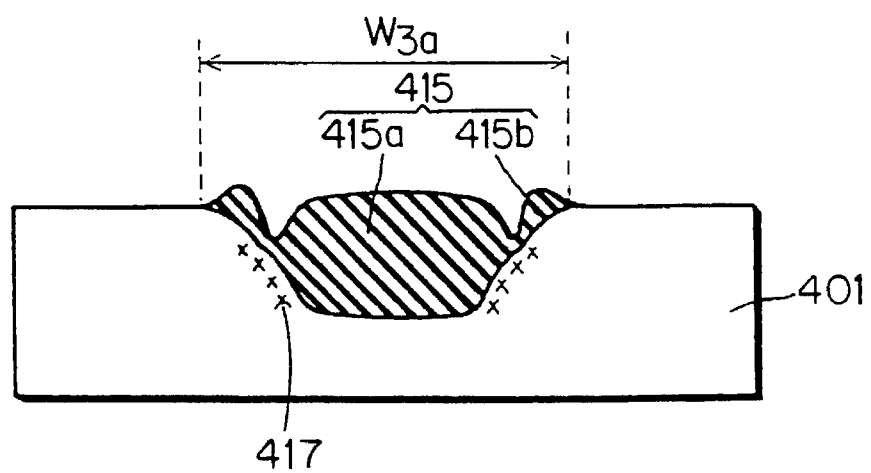
Figure 50:
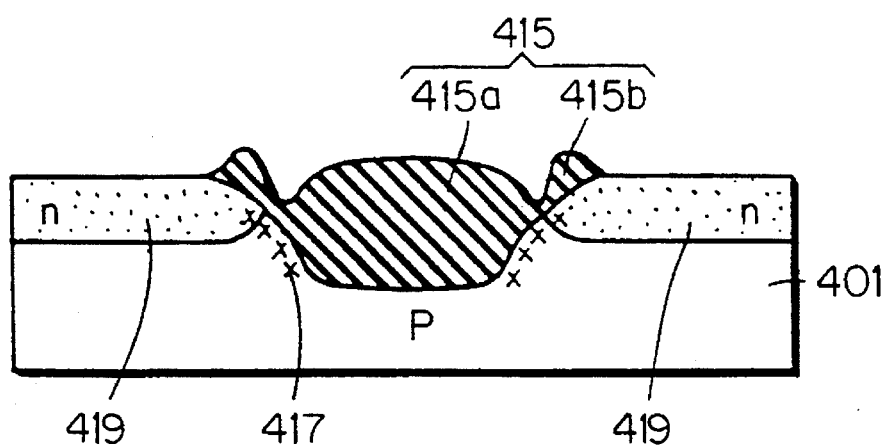
Figure 51:
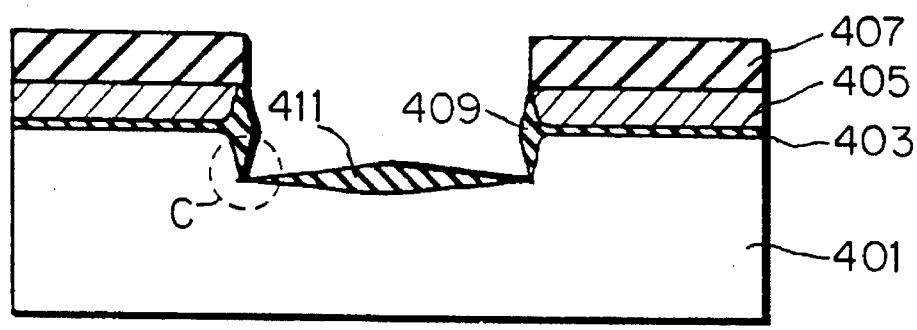
FIG. 51 is a cross section showing difficulty in forming an oxide film at the corner portion of the opening by thermal oxidation.

Referring to FIG. 42, when second silicon oxide film 411 is formed by oxidation as in the conventional method, polycrystalline silicon film 405 and silicon substrate 401 exposed at the sidewall of opening 409 are oxidized by the thickness $T_{O3}$ from the sidewall of opening 409 toward the outer periphery indicated by the arrow R. As a result, the length $W_{3a}$ of element isolation oxide film 415 becomes longer by the oxidized thickness $T_{O3}$ toward the outer periphery, as shown in FIG. 49.

On the other hand, referring to FIG. 11, when second silicon oxide film 111 is formed by a CVD method, it is deposited on the inner peripheral wall of opening 109. Specifically, in a CVD method, second silicon oxide film 111 is deposited onto the inner periphery as indicated by arrow Q, unlike polycrystalline silicon film 405 and the like being oxidized toward the outer periphery as shown in FIG. 42. This prevents element isolation oxide film 115 shown in FIG. 15 to extend significantly toward the outer periphery by the thickness of second silicon oxide film 111. Formation of the second silicon oxide film by a CVD method, therefore, can suppress formation of a bird's beak more effectively than by oxidation.

The thickness of second silicon oxide film 111 can be made large for the above reason. Since the thickness $T_{O5}$ of first silicon oxide film 111 shown in FIG. 13 can be made large, the ratio $T_{O5}/T_{N5}$ of the thickness $T_{O5}$ to the height $T_{N5}$ of sidewall nitride film 113 along the sidewall thereof can also be increased, so that introduction of a defect into silicon substrate 101 caused by the ratio $T_{O5}/T_{N5}$ being small can be suppressed. Accordingly, reduction in the junction breakdown voltage caused by distribution of defects in the vicinity of the p-n junction portion of an impurity region, not shown, and silicon substrate 101 can be prevented.

By a CVD method, second silicon oxide film 111 is formed to have a uniform thickness. This prevents the thickness of second silicon oxide film 111 to be decreased at the corner portion (region $C_1$) of opening 109 as shown in FIG. 11, and thus, prevents the ratio $T_{O5}/T_{N5}$ of the thickness $T_{O5}$ of first silicon oxide film 111 to the height $T_{N5}$ of sidewall nitride film 113 to be decreased at the corner portion of opening 109 as shown in FIG. 13. Consequently, introduction of many defects can be prevented around the corner portion.

Referring to FIG. 13, as in the first embodiment, provision of sidewall nitride film 113 can decrease the dimension of the surface of second silicon oxide film 111 exposed at the bottom of opening 109 smaller than the minimum processed dimension $L_5$ (=0.3 μm) formed by photolithography. It is thus possible to decrease the length $W_5$ of element isolation oxide film 115 formed at the bottom of opening 109 as shown in FIG. 15 smaller than the minimum process dimension $L_5$.

In the method of manufacturing the semiconductor device in the second embodiment of the present invention, second opening 109b is formed on silicon substrate 101 in the step shown in FIG. 10, and subsequently, element isolation oxide film 115 is formed at the bottom of opening 109 in the step shown in FIG. 14. Element isolation oxide film 115 formed in the second embodiment of the present invention is formed at the deeper region (in the depth direction) from the upper surface of silicon substrate 101 than element isolation oxide film 15 formed in the first embodiment shown in FIG. 7. Accordingly, a smaller step is formed by element isolation oxide film 115 and silicon substrate 101 than that formed by element isolation oxide film 15 shown in FIG. 7, so that the surface is planarized better. This facilitates patterning of a gate electrode and an aluminum wiring layer to be formed on element isolation oxide film 115.

Moreover, since element isolation oxide film 115 shown in FIG. 15 is formed at the deeper region (in the depth direction) from the upper surface of silicon substrate 101, electrical isolation effects can be enhanced between impurity regions formed at both ends of element isolation oxide film 115.

Figure 16:
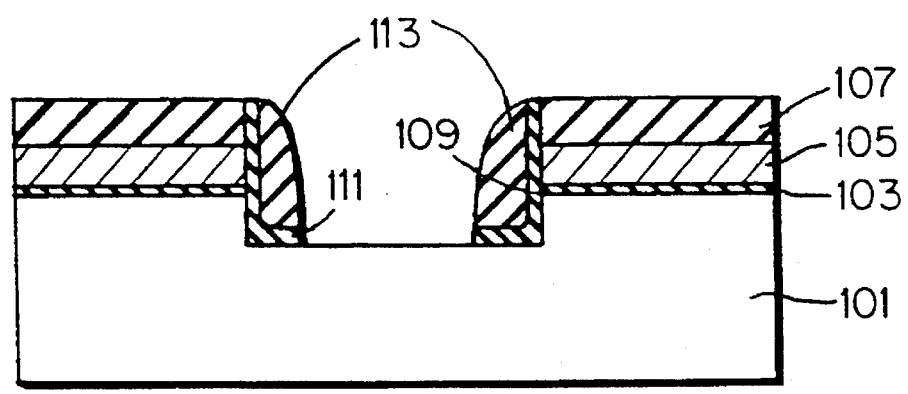
FIG. 16 is a cross section showing removal of the second silicon oxide film in the second embodiment of the present invention.

In the second embodiment, thermal oxidation is performed for forming element isolation oxide film 115 with second silicon oxide film 111 being formed on silicon substrate 101 and first silicon nitride film 107 as shown in FIG. 13. Second silicon oxide film 111 may be etched with sidewall nitride film 113 as a mask, after forming sidewall nitride film 113 as shown in FIG. 16. That is, thermal oxidation for forming an element isolation oxide film may be performed with first silicon oxide film 111 on silicon substrate 101 and first silicon nitride film 107 being removed.

In the first and second embodiments, polycrystalline silicon films 5 and 105 are provided between first silicon oxide films 3 and 103 and first silicon nitride films 7 and 107, respectively. Polycrystalline silicon films 5 and 105 have a higher oxidation rate than that of a silicon nitride film. Therefore, oxidation in the longitudinal direction (the thickness direction) is dominant while oxidation in the lateral direction is suppressed, whereby formation of a bird's beak is suppressed. While polycrystalline silicon films 5 and 105 have suppressing effect on formation of a bird's beak, sufficient effect can be obtained without interposing a polycrystalline silicon film between first silicon oxide film 3 and first silicon nitride film 7 as in the third and fourth embodiment.

EMBODIMENT 3

Description will now be made on a method of manufacturing the semiconductor device in a third embodiment of the present invention.

Figure 18:
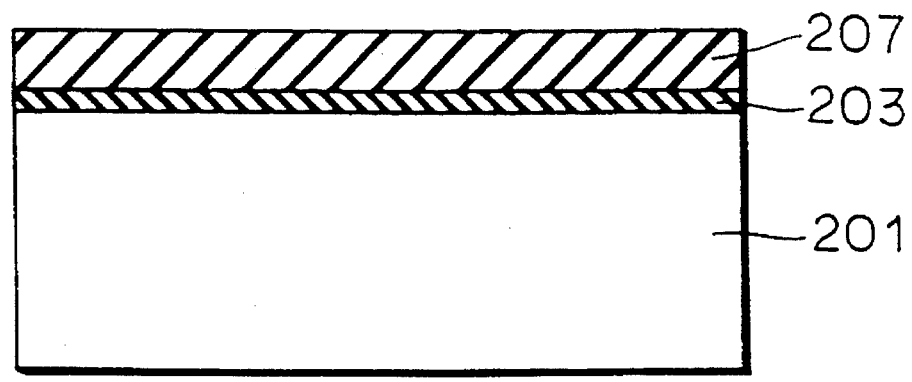
FIGS. 18 to 23 are cross sections showing in sequence the steps of a method of manufacturing a semiconductor device in a third embodiment of the present invention.

Referring to FIG. 18, a silicon substrate 201 is oxidized to form a first silicon oxide film 203 having the thickness of approximately 300 Å on the whole surface of silicon substrate 201. A first silicon nitride film 207 having the thickness of approximately 500 Å is formed on the whole surface of first silicon oxide film 203 by a CVD method or the like.

Figure 19:
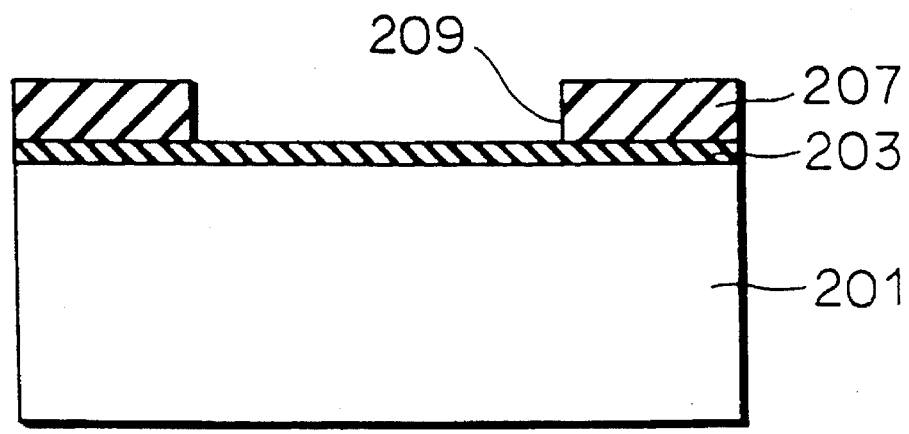

Referring to FIG. 19, an opening 209 is formed on first silicon nitride film 207 by photolithography and etching. Opening 209 has the opening diameter corresponding to the minimum processed dimension of 0.3 μm formed by photolithography.

Figure 20:
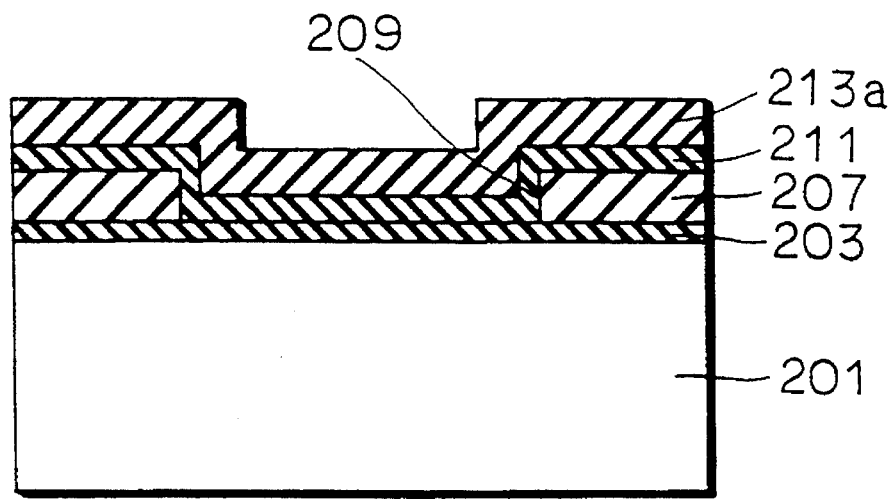

Referring to FIG. 20, a second silicon oxide film 211 having the thickness of approximately 300 Å is formed on the surface of first silicon oxide film 203 and first silicon nitride film 207 so as to cover the inner wall of opening 209 by a CVD method. A second silicon nitride film 213a having the thickness of approximately 500 Å is formed on the whole surface of second silicon oxide film 211. The whole surface of second silicon nitride film 213a is subjected to anisotropical etching where second silicon nitride film 213a is overetched by 20 to 30% of its thickness. In this etching, second silicon oxide film 211 serves as an etching stopper, so that the thickness of first silicon nitride film 207 cannot be decreased.

Figure 21:
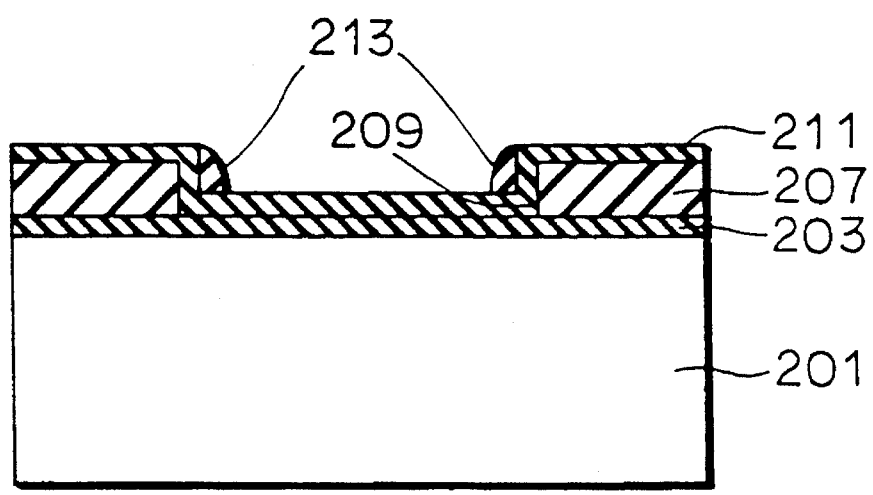

Referring to FIG. 21, through the above etching, a sidewall nitride film 213 is formed on the surface of second silicon oxide film 211 so as to cover the sidewall of opening 209.

Thereafter, thermal oxidation is performed at the temperature of approximately 950° to 1100° C. with sidewall nitride film 213 and the like as a mask. The thermal oxidation takes two to three hours at 950° C., and 30 minutes at 1100° C.

Figure 22:
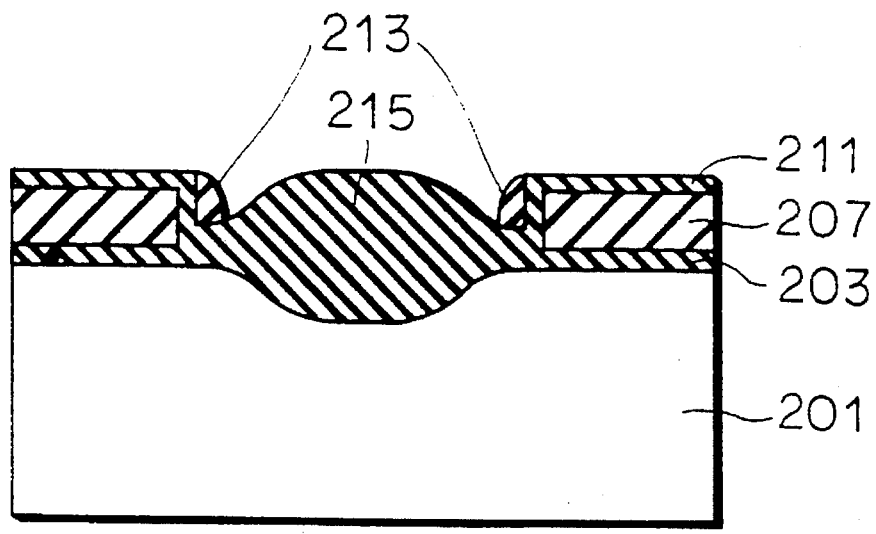
Figure 23:
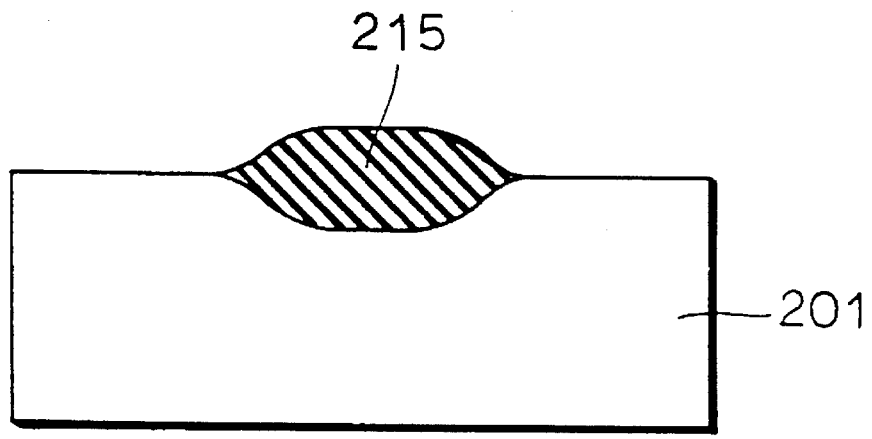

Referring to FIG. 22, through this thermal oxidation, an element isolation oxide film 215 having the thickness of approximately 5000 Å is formed at the bottom of opening 209. Sidewall nitride film 213, second silicon oxide film 211, first silicon nitride film 207 and first silicon oxide film 203 are sequentially etched away, resulting in the state shown in FIG. 23.

In the method of manufacturing the semiconductor device in the third embodiment of the present invention, second silicon oxide film 211 is formed on the surface of first silicon nitride film 207 by a CVD method in the step shown in FIG. 20. Similarly to the first embodiment, this prevents the thickness of first silicon nitride film 207 to be decreased in etching for forming sidewall nitride film 213. As a result, formation of a bird's beak can be suppressed in forming element isolation oxide film 215, so that miniaturized element isolation oxide film 215 can be formed.

In the step shown in FIG. 20, second silicon oxide film 211 is formed on the surface of first silicon oxide film 203 at the bottom of opening 209 by a CVD method. The thickness of the silicon oxide film on silicon substrate 201 is thus ensured by the thicknesses of first and second silicon oxide films 203 and 211, whereby introduction of a defect into silicon substrate 201 in thermal oxidation for forming element isolation oxide film 215 can be suppressed. Accordingly, reduction in the junction breakdown voltage due to distribution of defects in the vicinity of the p-n junction portion of an impurity region, not shown, and silicon substrate 201 can be suppressed.

As shown in FIG. 21, sidewall nitride film 213 is formed prior to thermal oxidation for forming element isolation oxide film 215. This enables formation of a miniaturized element isolation oxide film, as in the first embodiment.

EMBODIMENT 4

Description will now be made on a method of manufacturing a semiconductor device in a fourth embodiment of the present invention.

Figure 24:
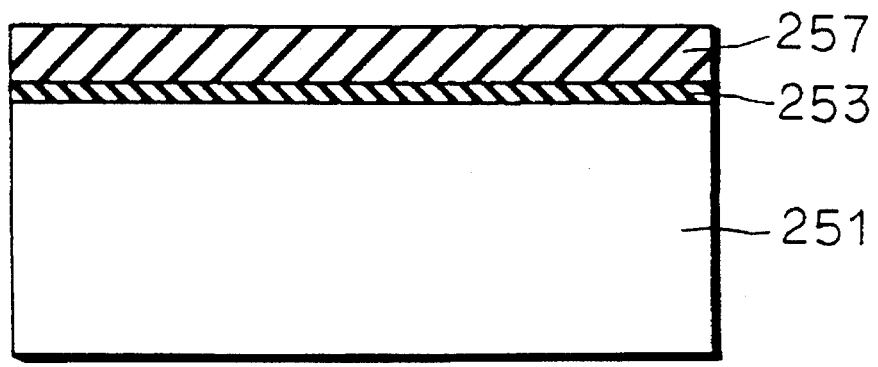
FIGS. 24 to 29 are cross sections showing in sequence the steps of a method of manufacturing a semiconductor device in a fourth embodiment of the present invention.

Referring to FIG. 24, a surface of a silicon substrate 251 is oxidized to form a first silicon oxide film 253 having the thickness of approximately 300 Å. A first silicon nitride film 257 having the thickness of approximately 500 Å is formed on the surface of first silicon oxide film 253 by a CVD method.

Figure 25:
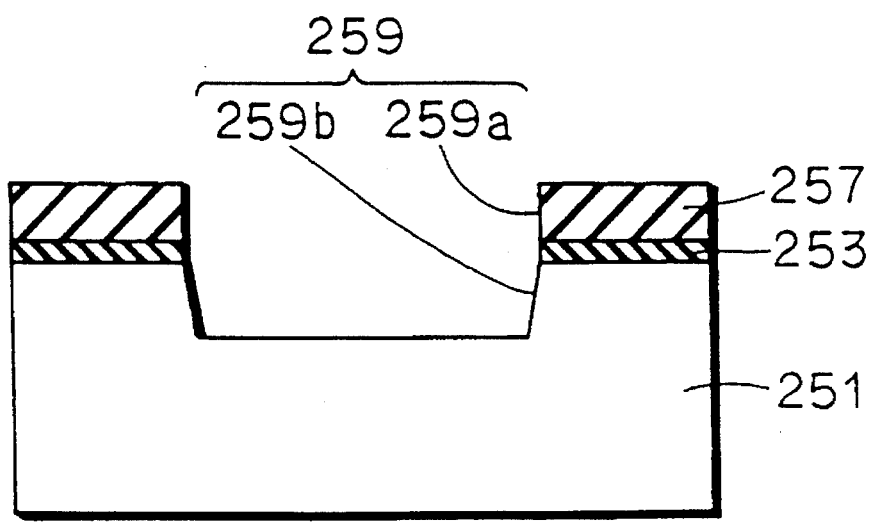

Referring to FIG. 25, an opening 259a exposing silicon substrate 251 is formed on first silicon nitride film 257 and first silicon oxide film 253 by photolithography and etching and the like. Silicon substrate 251 is etched through opening 259a, so that a groove 259b in communication with opening 259a is formed. Groove 259b has the depth of approximately 1000 Å. Opening 259a and groove 259b constitute an opening 259.

Figure 26:
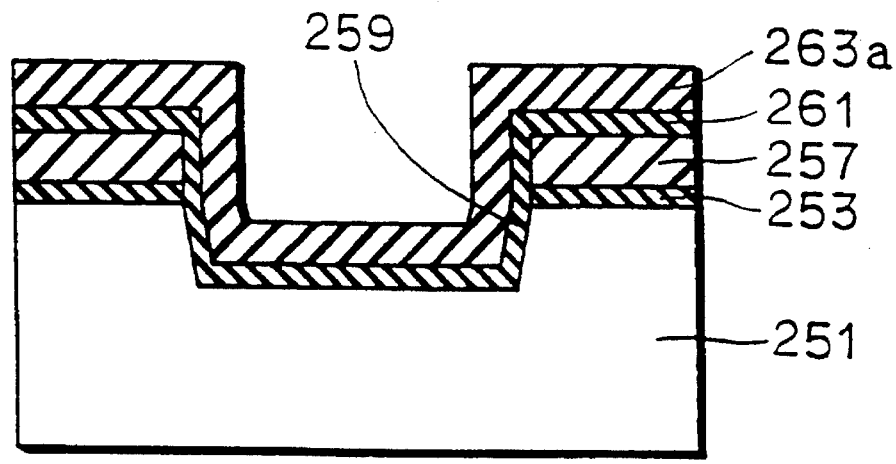

Referring to FIG. 26, a second silicon oxide film 261 having the thickness of approximately 300 Å is formed on the surface of silicon substrate 251 and first silicon nitride film 257 so as to cover the inner wall of opening 259 by a CVD method. A second silicon nitride film 263a having the thickness of approximately 500 Å is formed on the whole surface of second silicon oxide film 261 by a CVD method. The whole surface of second silicon nitride film 263a is subjected to anisotropical etching where silicon nitride film 263a is overetched by 20 to 30% of its thickness. In this etching, second silicon oxide film 261 serves as an etching stopper, so that decrease in the thickness of first silicon nitride film 257 is prevented.

Figure 27:
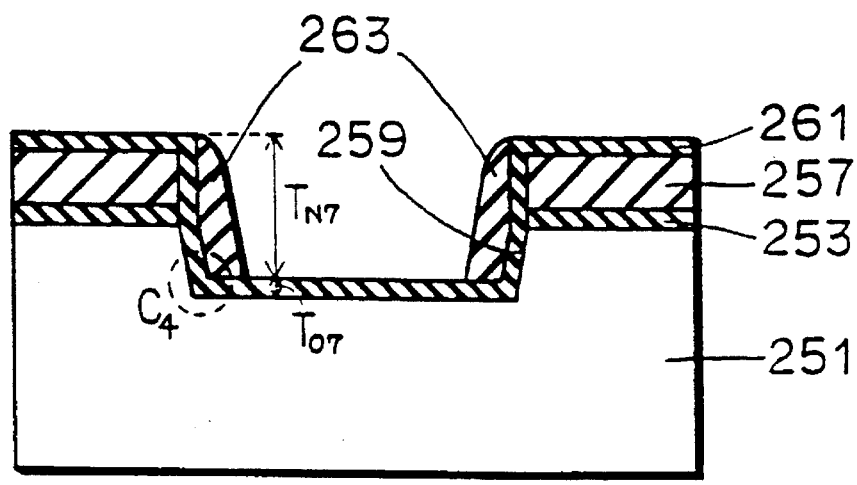

Referring to FIG. 27, through the above etching, a sidewall nitride film 263 is formed on the surface of second silicon oxide film 261 so as to cover the sidewall of opening 259. Thermal oxidation is performed on silicon substrate 251 at the temperature of 950° to 1100° C. with sidewall nitride film 263 as a mask. This thermal oxidation takes two to three hours at 950° C. and 30 minutes at 1100° C., approximately.

Figure 28:
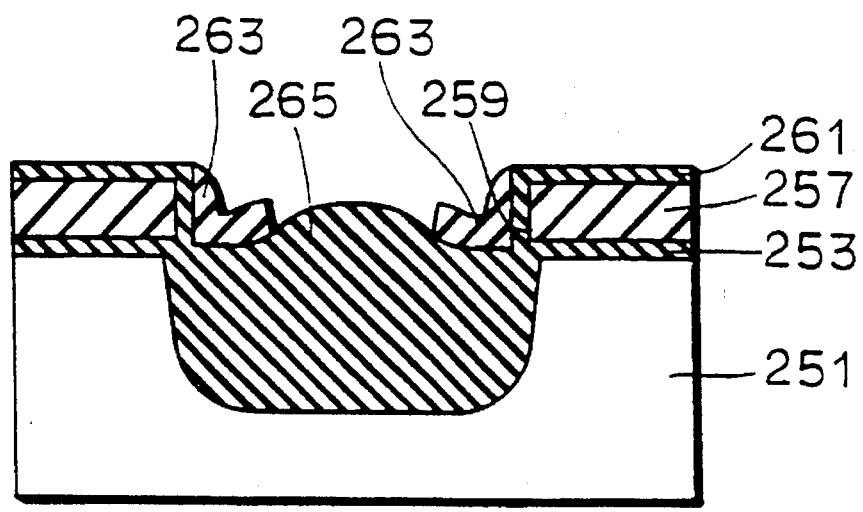
Figure 29:
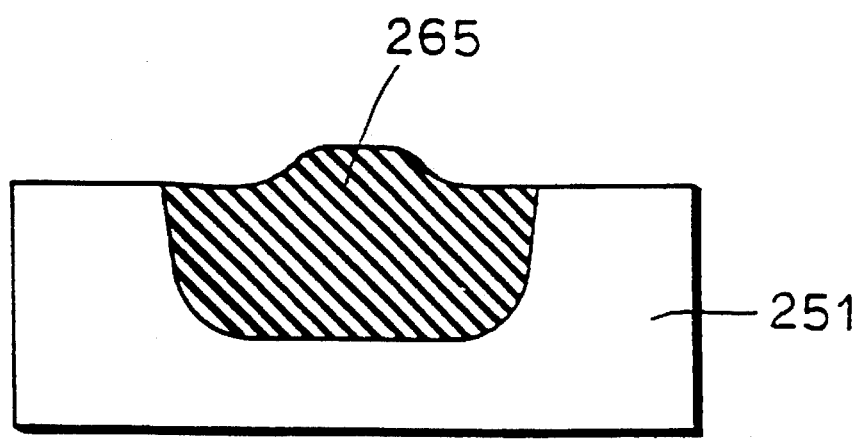

Referring to FIG. 28, through this thermal oxidation, an element isolation oxide film 265 having the thickness of approximately 5000 Å is formed at the bottom of opening 259. Sidewall nitride film 263, second silicon oxide film 261, first silicon nitride film 257 and first silicon oxide film 253 are sequentially etched away, resulting in the state shown in FIG. 29.

In the method of manufacturing the semiconductor device in the fourth embodiment of the present invention, second silicon oxide film 261 is formed on the surface of first silicon nitride film 257 by a CVD method in the step shown in FIG. 26. Accordingly, as in the first and second embodiments, first silicon nitride film 257 cannot be etched in forming sidewall nitride film 263. This suppresses formation of a bird's beak and a bird's head caused by thermal oxidation for forming element isolation oxide film 260, whereby miniaturized element isolation oxide film 265 can be formed.

In the step shown in FIG. 26, second silicon oxide film 261 is formed on the surface of silicon substrate 251 at the bottom of opening 259 by a CVD method. Accordingly, as in the second embodiment, a defect cannot be easily introduced into silicon substrate 251 in thermal oxidation for forming element isolation oxide film 265. As a result, reduction in the junction breakdown voltage due to distribution of defects in the vicinity of the p-n junction portion of an impurity region, not shown, and silicon substrate 251 can be prevented.

Second silicon oxide film 261 covering the inner wall of opening 259 is formed by a CVD method. By a CVD method, silicon oxide film 261 can be formed to have the uniform thickness, so that the thickness of second silicon oxide film 261 cannot be reduced at the corner portion (region $C_4$) of opening 259. This ensures a high ratio $T_{O7}/T_{N7}$ of a thickness $T_{O7}$ of second silicon oxide film to a height $T_{O7}$ of sidewall nitride film 263, whereby introduction of many defects into the corner portion in thermal oxidation for forming element isolation oxide film 265 can be prevented.

Figure 30:
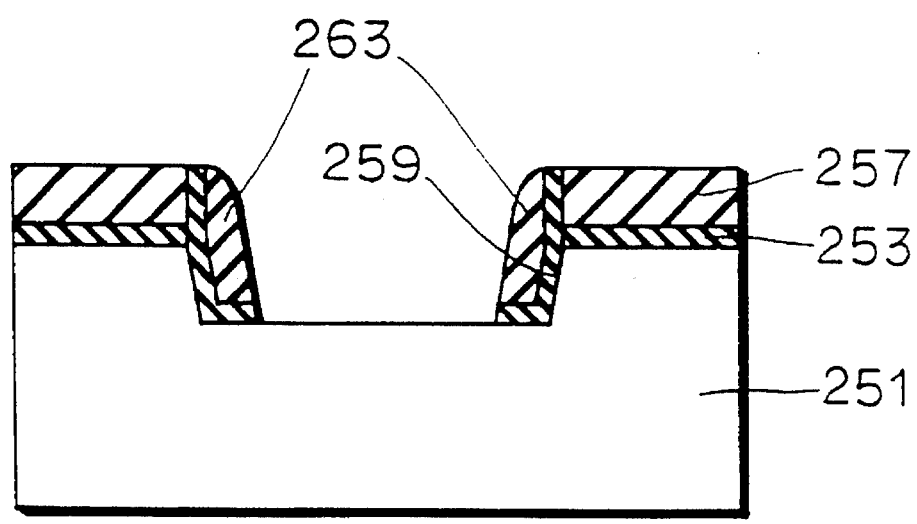
FIG. 30 is a cross section showing removal of the second silicon oxide film in the fourth embodiment of the present invention.
Figure 31:
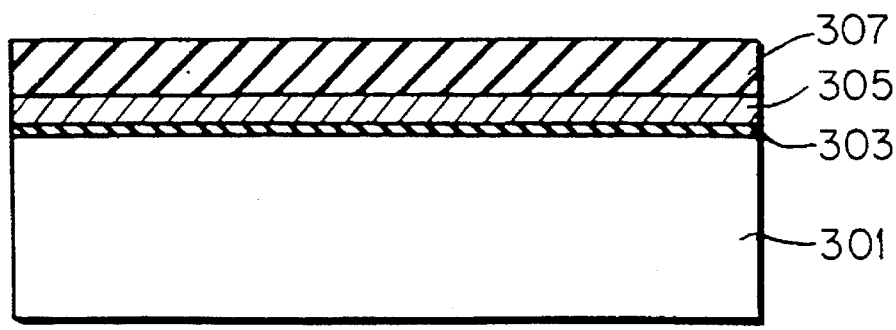
FIGS. 31 to 36 are cross sections showing in sequence the steps of a first conventional method of manufacturing a semiconductor devices.
Figure 32:
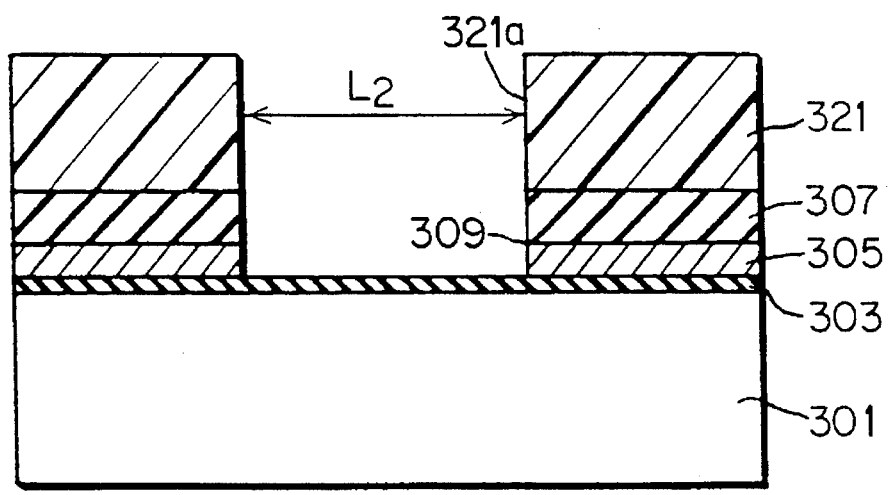
Figure 33:
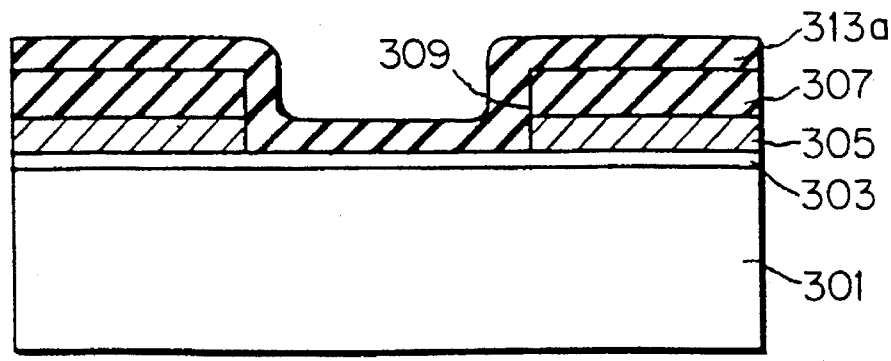
Figure 34:
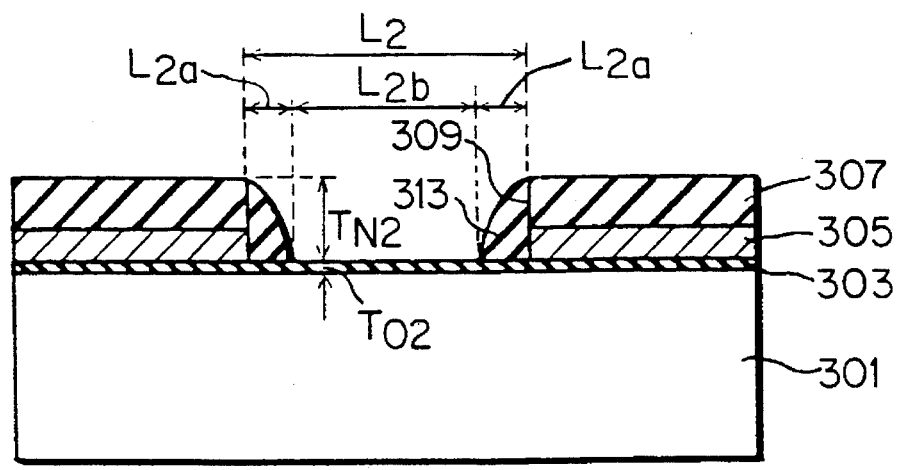
Figure 35:
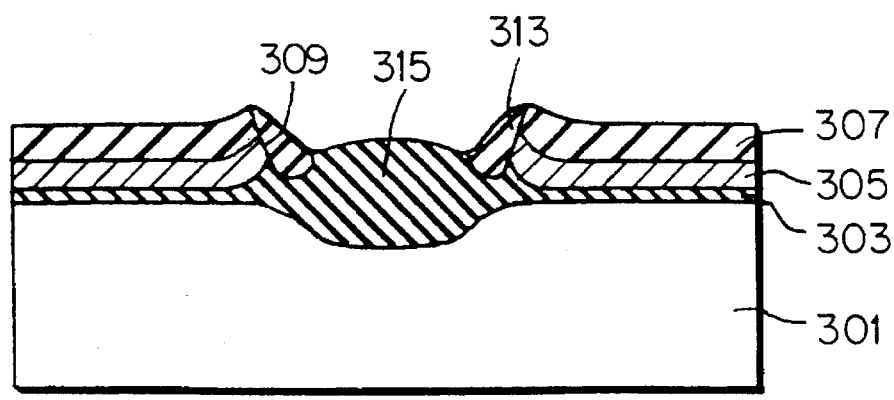
Figure 36:
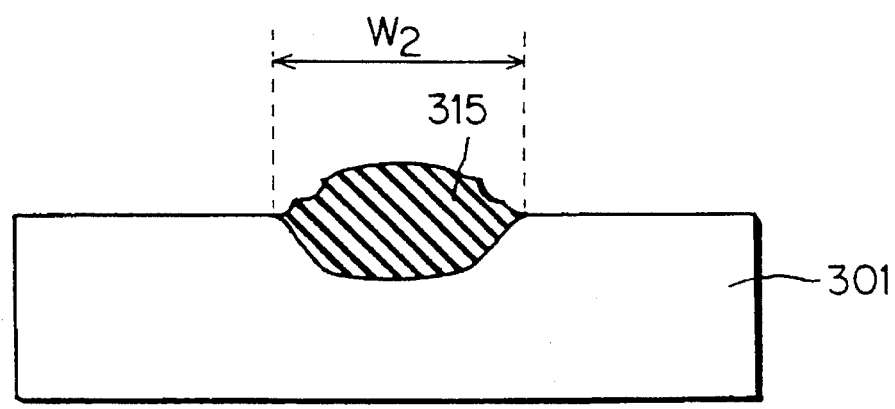
Figure 37:
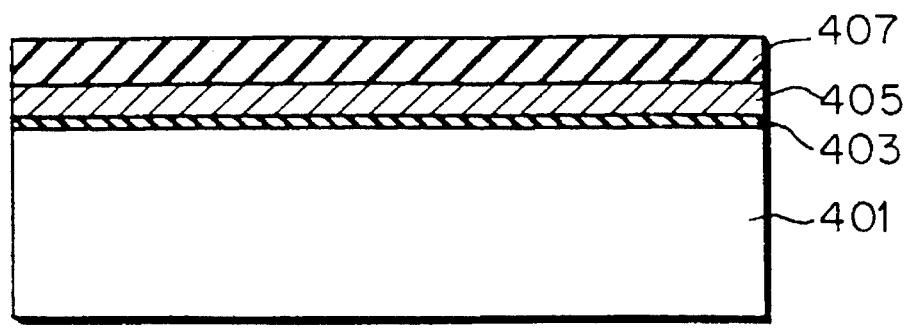
FIGS. 37 to 44 are cross sections showing in sequence the steps of a second conventional method of manufacturing a semiconductor device.
Figure 38:
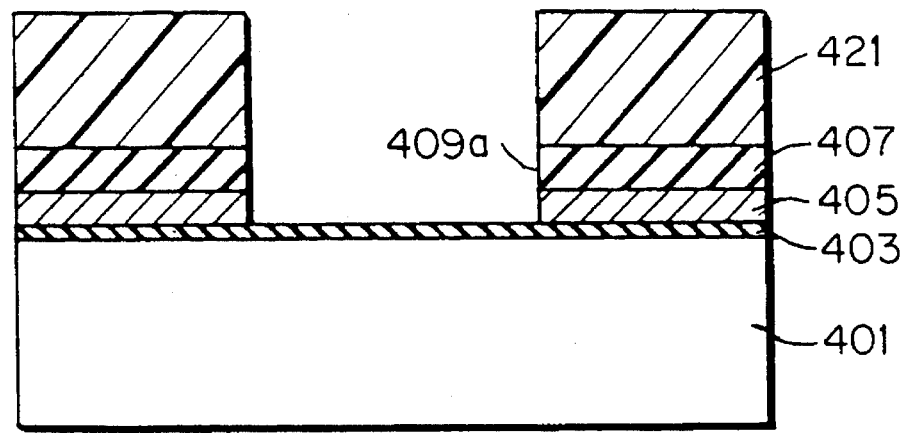
Figure 39:
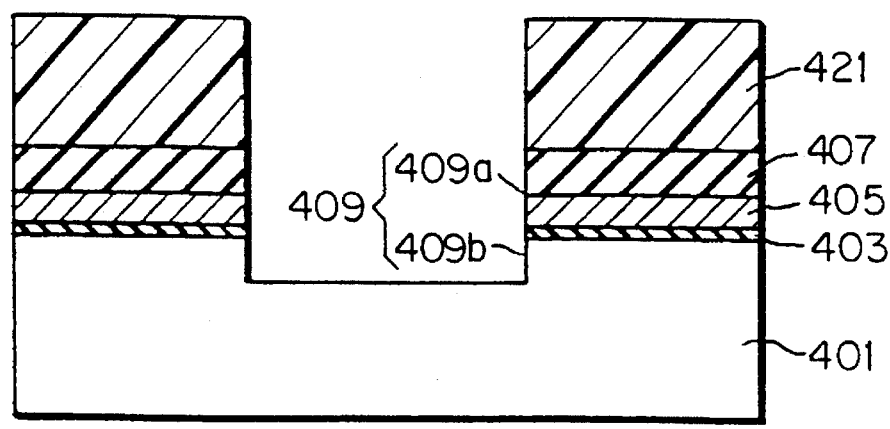

In the method of manufacturing the semiconductor device in the fourth embodiment of the present invention, second silicon oxide film 261 is formed on silicon substrate 251 and first silicon nitride film 257, as shown in FIG. 27. However, second silicon oxide film 261 on silicon substrate 251 and first silicon nitride film 257 may be removed after forming sidewall nitride film 253 as shown in FIG. 30.

In the methods of forming element isolation oxide films 15, 115, 215 and 265 of the first to fourth embodiments described above, a channel-cut region may be provided on the lower surface of each of element isolation oxide films 15, 115, 215 and 265. In this case, impurities are initially introduced into silicon substrates 1, 101, 201 and 251 with respective sidewall nitride films 13, 113, 213 and 263 as a mask, in the steps shown in FIGS. 5, 13, 21 and 27. The impurities are diffused and activated through thermal oxidation for forming each of element isolation oxide films 15, 115, 215, and 265, so that a channel-cut region is formed.

Figure 17:
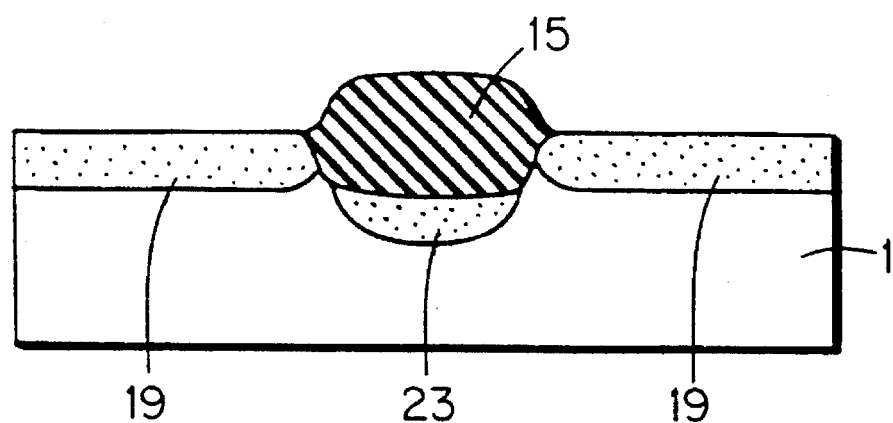
FIG. 17 is a cross section showing the structure of the element isolation oxide film and the channel-cut region formed in accordance with the method of manufacturing of the semiconductor device in the first embodiment of the present invention.

The channel-cut region thus formed is shown in FIG. 17 which corresponds to the first manufacturing method. Referring to the figure, a channel-cut region 23 is formed on the lower surface of element isolation oxide film 15 in silicon substrate 1. At either end of element isolation oxide film 15 is formed an impurity region 19. Impurity region 19 may be a source/drain region of an MOS transistor, for example.

In the first to fourth embodiments of the present invention, the larger thickness is preferable in first silicon nitride films 7, 107, 207 and 257, in order to decrease the length of a bird's beak.

In the first to fourth embodiments of the present invention, a defect such as a transfer loop cannot be formed through thermal oxidation for forming an element isolation oxide film on condition that a ratio $T_N/T_O$ of a height $T_N$ of the sidewall nitride film to a thickness $T_O$ of the first silicon oxide film (and the second silicon oxide film) is not more than 2.5. Considering formation of a small defect, the ratio $T_N/T_O$ is preferably not more than 2.

In the first to fourth manufacturing methods of the present invention, second silicon oxide films 11, 111, 211 and 261 shown in the steps of FIGS. 3 and 11 are formed by a CVD method. However, the forming steps of second silicon oxide films 11, 111, 211 and 261 are not limited to these. Any method may be employed with which respective second silicon oxide films are formed on the surfaces of first silicon nitride films 7, 107, 207 and 257 and on the surfaces of first silicon oxide film 3 and silicon substrate 101, so as to cover the inner walls of openings 9, 109, 209 and 259.

In the method of manufacturing the semiconductor device in accordance with the one aspect of the present invention, the second silicon oxide film is formed interposed between the first silicon nitride film and the second silicon nitride film. The second silicon oxide film serves as an etching stopper in etching of the second silicon nitride film, so that the first silicon nitride film cannot be etched together with the second silicon nitride film, and thus, decrease in the thickness of the first silicon nitride film is prevented. This suppresses formation of a bird's head and a bird's beak caused by oxidation of the polycrystalline silicon film and the silicon substrate, whereby the length of the element isolation oxide film can be reduced, and miniaturization can be implemented.

The first and second silicon oxide films are formed interposed between the silicon substrate and the sidewall nitride film. The thickness of the silicon oxide film is ensured between the :silicon substrate and the sidewall nitride film by these two layers. Additionally, the second silicon oxide film can be formed to have the large thickness. Accordingly, a stress caused by the difference between thermal expansion coefficients of the sidewall nitride film and the silicon substrate can be relaxed by the first and second silicon oxide films, whereby introduction of a defect into the surface of the silicon substrate, and the resultant reduction in the junction breakdown voltage are prevented.

In the method of manufacturing the semiconductor device in accordance with the another aspect of the present invention, the second silicon oxide film is formed between the first silicon nitride film and the second silicon nitride film. The second silicon oxide film serves as an etching stopper in etching of the second silicon nitride film, so that the first silicon nitride film cannot be etched in etching of the second silicon nitride film, and thus, reduction in the thickness of the first silicon nitride film is prevented. This suppresses formation of a bird's head and a bird's beak caused by oxidation of the polycrystalline silicon film and the silicon substrate, whereby a miniaturized element isolation oxide film can be formed, and miniaturization of the structure can be implemented.

The second silicon oxide film is formed interposed between the silicon substrate and the sidewall nitride film. The second silicon oxide film can be formed to have the large thickness. Accordingly, a stress caused by the difference between thermal expansion coefficient of the sidewall nitride film and the silicon substrate can be relaxed by the second silicon oxide film, whereby introduction of a defect to the surface of the silicon substrate, and the resultant reduction in the junction breakdown voltage are prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having an element isolation region, which method comprises:

forming a first silicon oxide film on a main surface of a semiconductor substrate, and a first silicon nitride film sequentially on said first silicon oxide film in a stack;

forming an opening having sidewalls in said stack;

forming a recess having a bottom surface and sidewalls in the main surface of the semiconductor substrate, wherein said recess is in communication with said opening;

forming a second silicon oxide film on said first silicon nitride film, on said recess sidewalls, on said opening sidewalls and on said recess bottom surface;

forming a second silicon nitride film on said second silicon oxide film;

etching said second silicon nitride film, without removing said second silicon oxide film, leaving a portion of said second silicon nitride film on said opening sidewalls and on said recess sidewalls extending to said second silicon oxide film on said recess bottom surface and exposing a portion thereof, thereby forming a silicon nitride sidewall film;

forming the element isolation region in said recess by thermal oxidation with said silicon nitride sidewall film as a mask during said thermal oxidation, wherein the ratio of the length of the silicon nitride sidewall film along a sidewall of said opening to the thickness of said second silicon oxide film is not more than 2.0.

2. The method of manufacturing the semiconductor device according to claim 1, further comprising the step of forming a polycrystalline silicon film between said first silicon oxide film and said first silicon nitride film, wherein said opening is formed in said first silicon nitride film and said polycrystalline silicon film so as to expose a side surface of said first silicon oxide film.

3. The method of manufacturing the semiconductor device according to claim 1, further comprising the step of removing said second silicon oxide film exposed at the bottom of said opening, wherein said thermal oxidation is performed for forming the element isolation oxide film at the bottom of said opening, after removing said second silicon oxide film exposed out of said sidewall nitride film.

4. The method of manufacturing the semiconductor device according to claim 1, wherein said second silicon oxide film is formed by a chemical vapor deposition method.

5. The method of manufacturing the semiconductor device according to claim 1, wherein said thermal oxidation is performed at a temperature of 950° C. to 1100° C.

6. The method of manufacturing the semiconductor device according to claim 1, wherein said step of forming the element isolation oxide film includes the step of forming said element isolation oxide film, and forming an impurity region on said silicon substrate, so as to contact with a lower surface of said element isolation oxide film by said thermal oxidation.

7. The method of manufacturing the semiconductor device according to claim 1, wherein said sidewall nitride film is formed by anisotropic etching of said second silicon nitride film.

8. The method of manufacturing the semiconductor device according to claim 1, wherein said opening and said recess are formed by photolithographic techniques.

9. A method of manufacturing a semiconductor device having an element isolation region, which method comprises:

forming a first silicon oxide film on a main surface of a semiconductor substrate, and a first silicon nitride film sequentially on said first silicon oxide film in a stack;

forming an opening having sidewalls in said stack;

forming a recess having a bottom surface and sidewalls in the main surface of the semiconductor substrate, wherein said recess is in communication with said opening;

forming a second silicon oxide film on said first silicon nitride film, on said recess sidewalls, on said opening sidewalls and on said recess bottom surface;

forming a second silicon nitride film on said second silicon oxide film;

etching said second silicon nitride film, without removing said second silicon oxide film, leaving a portion of said second silicon nitride film on said opening sidewalls and on said recess sidewalls extending to said second silicon oxide film on said recess bottom surface and exposing a portion thereof, thereby forming a silicon nitride sidewall film;

forming the element isolation region in said recess in a single thermal oxidation step with said silicon nitride sidewall film as a mask during said thermal oxidation.

* * * * *